US012756371B2

(12) United States Patent
Fukumitsu et al.

(10) Patent No.: US 12,756,371 B2
(45) Date of Patent: Oct. 6, 2026

(54) RESONANCE DEVICE AND MANUFACTURING METHOD FOR THE SAME

(71) Applicant: Murata Manufacturing Co., Ltd., Nagaokakyo (JP)

(72) Inventors: Masakazu Fukumitsu, Nagaokakyo (JP); Yoshiyuki Higuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 671 days.

(21) Appl. No.: 18/353,442

(22) Filed: Jul. 17, 2023

(65) Prior Publication Data

US 2023/0361741 A1 Nov. 9, 2023

Related U.S. Application Data

(63) Continuation of application No. PCT/JP2021/035307, filed on Sep. 27, 2021.

(30) Foreign Application Priority Data

Feb. 4, 2021 (JP) ................................ 2021-016700

(51) Int. Cl.
*H03H 3/007* (2006.01)
*H03H 9/02* (2006.01)
*H03H 9/24* (2006.01)

(52) U.S. Cl.
CPC ...... *H03H 3/0077* (2013.01); *H03H 9/02259* (2013.01); *H03H 9/2447* (2013.01)

(58) Field of Classification Search
None
See application file for complete search history.

(56) References Cited

U.S. PATENT DOCUMENTS 10,972,071 B2 * 4/2021 Nishimura ............... H03H 9/17
12,531,539 B2 * 1/2026 Goto ........................ H03H 9/17
(Continued)

FOREIGN PATENT DOCUMENTS

JP S5844734 A 3/1983
JP 2006186566 A 7/2006
(Continued)

OTHER PUBLICATIONS

International Search Report in PCT/JP2021/035307, mailed Dec. 14, 2021, 4 pages.

*Primary Examiner* — William J Klimowicz
(74) *Attorney, Agent, or Firm* — ArentFox Schiff LLP

(57) ABSTRACT

A manufacturing method is provided for a resonance device that includes preparing a collective board including first power supply terminals electrically connected to upper electrodes of a plurality of resonators, and a first coupling wire that electrically connects two or more of the first power supply terminals. The method includes dividing the collective board into a plurality of resonance devices. Moreover, the first power supply terminals include a first metal layer and a second metal layer covering the first metal layer. The first coupling wire includes a portion of the first metal layer that extends from a region covered with the second metal layer. The method further includes removing the portion of the first metal layer extending from the region covered with the second metal layer before the dividing the collective board into the plurality of resonance devices.

5 Claims, 14 Drawing Sheets

(56) References Cited

U.S. PATENT DOCUMENTS

| | | | | |
|---|---|---|---|---|
| 2018/0096972 | A1 * | 4/2018 | Fukumitsu | H10W 76/10 |
| 2019/0089321 | A1 * | 3/2019 | Morinaga | H03H 9/1014 |
| 2020/0112295 | A1 | 4/2020 | Kawai et al. | |
| 2020/0244222 | A1 * | 7/2020 | Umeda | H03B 5/36 |
| 2022/0182036 | A1 * | 6/2022 | Goto | H03H 9/17 |
| 2023/0119602 | A1 * | 4/2023 | Fukumitsu | H03H 3/0072 310/348 |
| 2023/0361740 | A1 * | 11/2023 | Higuchi | H03H 9/2447 |

FOREIGN PATENT DOCUMENTS

| | | | | | |
|---|---|---|---|---|---|
| JP | 2012212765 | A | | 11/2012 | |
| JP | 2016152476 | A | | 8/2016 | |
| WO | 2017212677 | A1 | | 12/2017 | |
| WO | 2018235339 | A1 | | 12/2018 | |
| WO | WO-2020045503 | A1 | * | 3/2020 | H03H 9/2489 |

* cited by examiner

100

RESONANCE DEVICE AND MANUFACTURING METHOD FOR THE SAME

CROSS REFERENCE TO RELATED APPLICATIONS

This application is a continuation of International Application No. PCT/JP2021/035307, filed Sep. 27, 2021, which claims priority to Japanese Patent Application No. 2021-016700, filed Feb. 4, 2021, the entire contents of each of which are hereby incorporated by reference in their entirety.

TECHNICAL FIELD

The present invention relates to a resonance device and a manufacturing method for the same.

BACKGROUND

Conventionally, devices manufactured using, for example, micro electro mechanical systems (MEMS) technology have been widespread. For example, after a plurality of devices are formed on a collective board (wafer), the wafer is divided into individual devices (chips) (hereinafter, also referred to as singulation or chip formation).

For example, International Publication No. 2017/212677 (hereinafter "Patent Document 1") discloses a manufacturing method for a resonance device in which a frequency adjustment step of adjusting a resonant frequency by applying a predetermined drive voltage to a resonator in a singulated state is performed.

In the manufactured method disclosed in Patent Document 1, it is necessary to connect a probe to a terminal of each individual resonance device and apply a drive voltage for the frequency adjustment step. As a result, these steps take time to perform the frequency adjustment for each and every resonance device.

As a method of shortening the time for the frequency adjustment and improving productivity, it is conceivable to provide a coupling wire for electrically connecting terminals of the resonance devices on the wafer and collectively perform the frequency adjustment before the division into the resonance devices. However, when the terminals of the resonance devices and the coupling wire are separately formed, productivity is reduced due to an increase in the number of manufacturing steps. When the terminals of the resonance devices and the coupling wire are integrally formed, the coupling wire on a division line is deformed in the step of dividing into the resonance devices. At this time, the deformed coupling wire and another terminal of the resonance device may be short-circuited, such that a defective product may be made.

SUMMARY OF THE INVENTION

Accordingly, it is an object of the invention to provide a resonance device and a manufacturing method for the resonance device with improved productivity.

In an exemplary aspect, a manufacturing method for a resonance device is provided that includes preparing a collective board including a first substrate including a plurality of resonators that each have an upper electrode and a lower electrode, and a second substrate bonded on a side of the first substrate. In this aspect, the collective board includes a plurality of first power supply terminals electrically connected to the upper electrodes of the plurality of resonators, and a first coupling wire that electrically connects at least two of the plurality of first power supply terminals. The method includes dividing the collective board into a plurality of resonance devices.

Moreover, the plurality of first power supply terminals are formed from a first metal layer provided on a side of the second substrate opposite to the first substrate, and a second metal layer covering the first metal layer.

The first coupling wire includes a portion of the first metal layer extending from a region covered with the second metal layer.

The method further includes removing the portion of the first metal layer extending from the region covered with the second metal layer before the dividing the collective board into the plurality of resonance devices.

In another exemplary aspect, a resonance device according is provided that includes a first substrate including a resonator including an upper electrode and a lower electrode; and a second substrate bonded on a side of the first substrate close to the resonator.

The second substrate includes a semiconductor substrate, a first power supply terminal and a second power supply terminal provided on a side of the semiconductor substrate opposite to the first substrate, electrically connected to a portion of the upper electrode, and insulated from each other, a ground terminal provided on the side of the semiconductor substrate opposite to the first substrate and electrically connected to the lower electrode, and an insulating layer provided between the semiconductor substrate and the first power supply terminal and between the semiconductor substrate and the second power supply terminal.

When a side of the second substrate opposite to the first substrate is seen in a plan view, the insulating layer includes a central region spaced apart from an outer edge of the second substrate and a coupling region extending from the central region and reaching the outer edge of the second substrate.

According to the exemplary aspects of the present invention, the resonance device and the manufacturing method for the resonance device are provided with improved productivity.

DETAILED DESCRIPTION OF EMBODIMENTS

Figure 1:
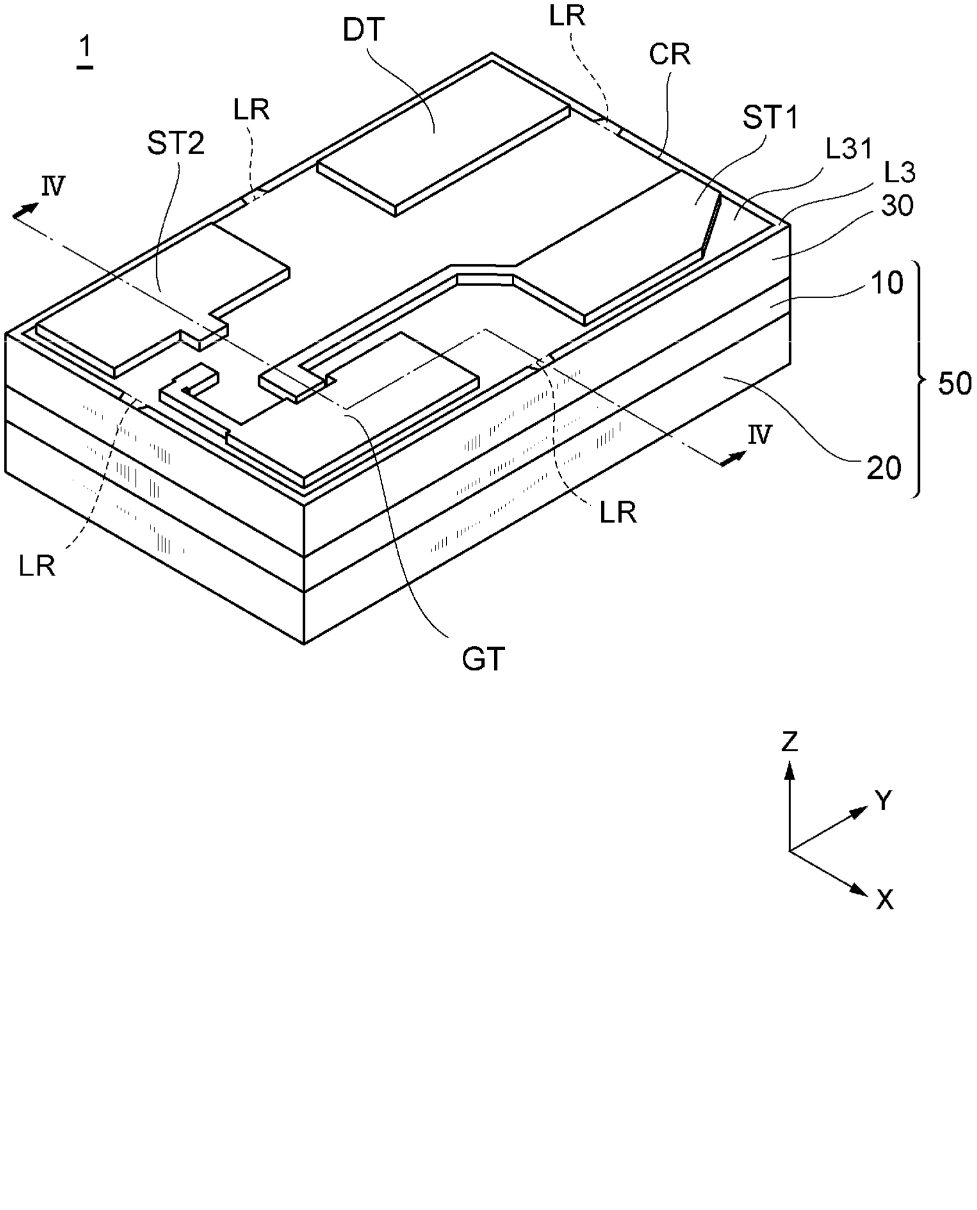
FIG. 1 is a perspective view schematically illustrating an external appearance of a resonance device according to an exemplary embodiment.

Exemplary embodiments of the present invention will be described below. In the following description of the drawings, the same or similar components are denoted by the same or similar reference numerals. The drawings are examples, and dimensions and shapes of respective parts are schematic, and the technical scope of the present invention is not limited to the embodiments.

<Resonance Device>

Figure 2:
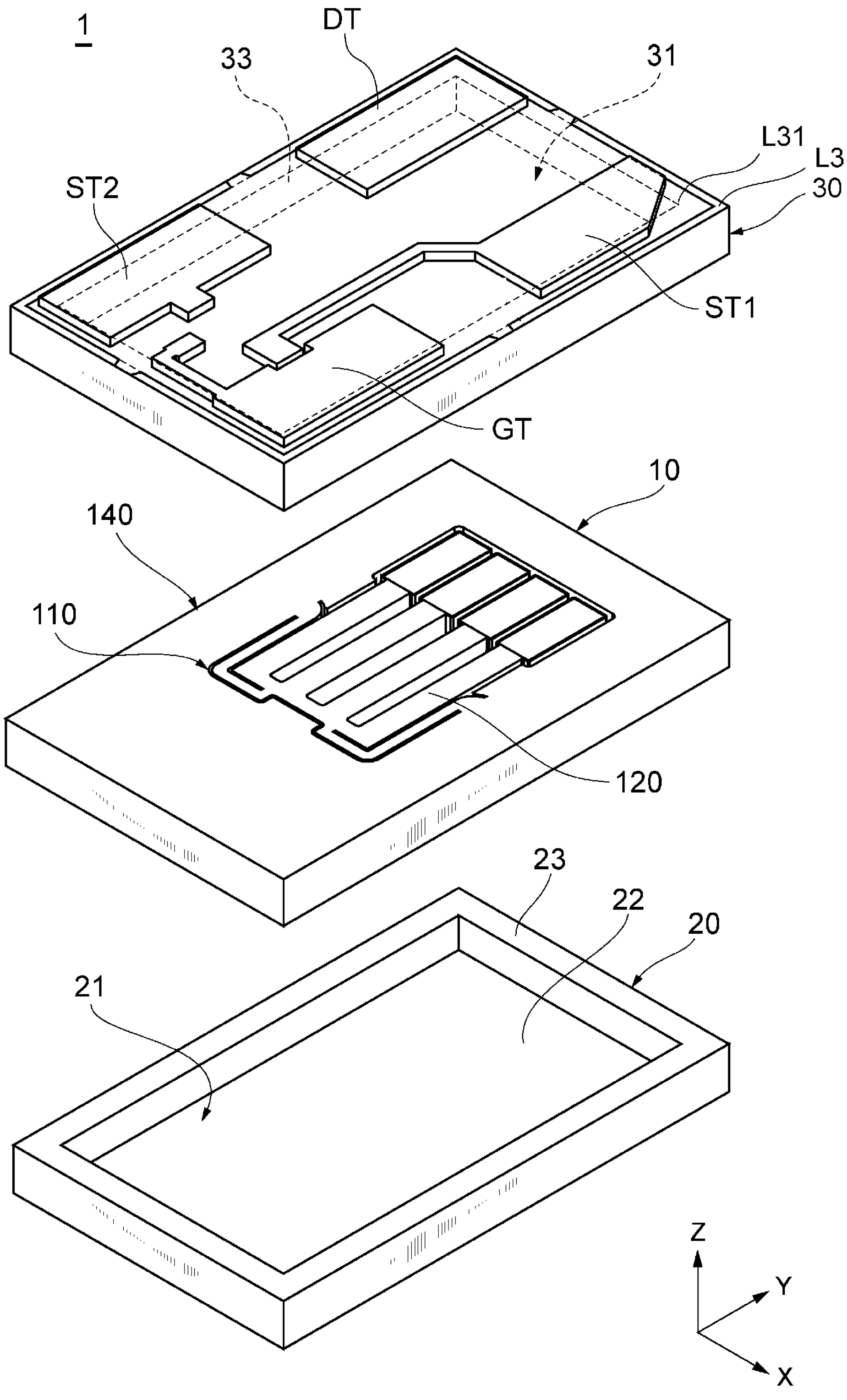
FIG. 2 is an exploded perspective view schematically illustrating a structure of the resonance device illustrated in FIG. 1.

First, a schematic configuration of a resonance device 1 according to an exemplary embodiment will be described with reference to FIGS. 1 and 2. FIG. 1 is a perspective view schematically illustrating an external appearance of the resonance device according to the embodiment of the present invention. FIG. 2 is an exploded perspective view schematically illustrating a structure of the resonance device illustrated in FIG. 1.

As illustrated in FIGS. 1 and 2, the resonance device 1 includes a resonator 10, and a lower lid 20 and an upper lid 30 that form a vibration space in which the resonator 10 vibrates. That is, the resonance device 1 is formed by stacking the lower lid 20, the resonator 10, a bonding portion 60 (described below), and the upper lid 30 in this order. For purposes of this disclosure, a MEMS substrate 50 (the lower lid 20 and the resonator 10) corresponds to an example of a "first substrate". Moreover, the upper lid 30 corresponds to an example of a "second substrate".

Hereinafter, each configuration of the resonance device 1 will be described. In the following description, a side of the resonance device 1 on which the upper lid 30 is provided is referred to as an upper side (or a front side), and a side of the resonance device 1 on which the lower lid 20 is provided is referred to as a lower side (or a back side).

In an exemplary aspect, the resonator 10 is a MEMS vibrator manufactured using the MEMS technology. The resonator 10 and the upper lid 30 are bonded to each other using a bonding portion 60. The resonator 10 and the lower lid 20 each are formed using a silicon (Si) substrate (hereinafter referred to as a "Si substrate"). The Si substrates are bonded to each other. Alternatively, the resonator 10 and the lower lid 20 each may be formed using an SOI substrate.

The upper lid 30 extends in a flat plate shape along an XY plane. A recess 31 having, for example, a flat rectangular-parallelepiped shape is formed on the lower side of the upper lid 30. The recess 31 is surrounded by a side wall 33 and forms a portion of a vibration space that is a space in which the resonator 10 vibrates. Alternatively, the upper lid 30 may have a flat plate shape without the recess 31. In addition, a getter layer for adsorbing an out gas may be formed on a surface of the recess 31 of the upper lid 30 close to the resonator 10.

As further shown, two power supply terminals ST1 and ST2, a ground terminal GT, and a dummy terminal DT are provided on an upper surface of the upper lid 30. The power supply terminals ST1 and ST2 are used to provide drive signals (e.g., drive voltages) to the resonator 10. The power supply terminals ST1 and ST2 are electrically connected to upper electrodes 125A, 125B, 125C, and 125D of the resonator 10 (described below). The ground terminal GT is used to provide a reference potential to the resonator 10. The ground terminal GT is electrically connected to a lower electrode 129 of the resonator 10 (described below). In contrast, the dummy terminal DT is not electrically connected to the resonator 10. For purposes of this disclosure, the power supply terminal ST1 corresponds to an example of a "first power supply terminal", and the power supply terminal ST2 corresponds to an example of a "second power supply terminal".

In an exemplary aspect, the power supply terminals ST1 and ST2, the ground terminal GT, and the dummy terminal DT are formed by stacking a metal layer ML1 and a metal layer ML2 in this order from a Si wafer L3 side. The metal layer ML1 is connected to through electrodes V1 and V2, and the metal layer ML2 covers the metal layer ML1. The metal layer ML1 is a seed film for plating, and is formed by stacking, for example, a Cu seed formed by sputtering and a Ti barrier metal in this order from the Si wafer L3 side. For purposes of this disclosure, the metal layer ML1 corresponds to an example of a "first metal layer", and the metal layer ML2 corresponds to an example of a "second metal layer".

The lower lid 20 includes a bottom plate 22 having a rectangular flat plate shape provided along the XY plane and a side wall 23 extending from a peripheral edge portion of the bottom plate 22 in the Z-axis direction, that is, in the stacking direction of the lower lid 20 and the resonator 10. A recess 21 is formed in a surface of the lower lid 20 facing the resonator 10 by an upper surface of the bottom plate 22 and an inner surface of the side wall 23. The recess 21 forms a portion of the vibration space of the resonator 10. Alternatively, the lower lid 20 may have a flat plate shape without the recess 21. In addition, a getter layer for adsorbing an out gas may be formed on a surface of the recess 21 of the lower lid 20 close to the resonator 10.

Figure 3:
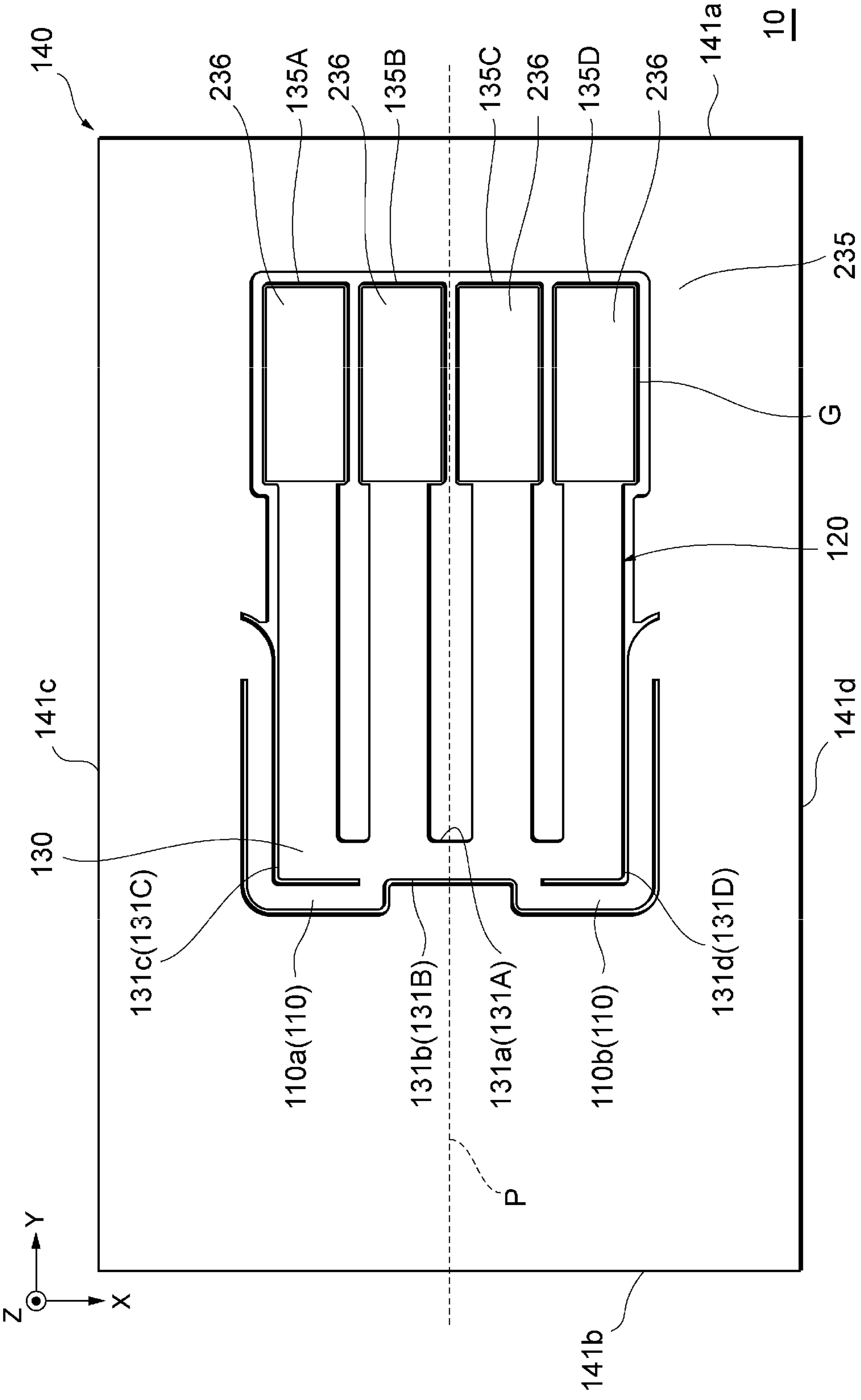
FIG. 3 is a plan view schematically illustrating a structure of a resonator illustrated in FIG. 1.

Next, a schematic configuration of the resonator 10 in the resonance device 1 according to an exemplary embodiment will be described with reference to FIG. 3. FIG. 3 is a plan view schematically illustrating a structure of the resonator illustrated in FIG. 1.

As illustrated in FIG. 3, the resonator 10 is a MEMS vibrator manufactured using the MEMS technology. The resonator 10 has an upper surface and a lower surface extending along the XY plane in the orthogonal coordinate system in FIG. 3, and performs out-of-plane bending vibration with respect to the XY plane. It is noted that the resonator 10 is not limited to the resonator using the out-of-plane bending vibration mode. The resonator of the resonance device 1 may use, for example, an expansion vibration mode, a thickness longitudinal vibration mode, a Lamb wave vibration mode, an in-plane bending vibration mode, or a surface acoustic wave vibration mode. Such a vibrator is applied to, for example, a timing device, an RF filter, a duplexer, an ultrasonic transducer, a gyro sensor, an acceleration sensor, or the like. Moreover, such a vibrator may be used for a piezoelectric mirror having an actuator function, a piezoelectric gyroscope, a piezoelectric microphone having a pressure sensor function, an ultrasonic vibration sensor, or the like. Furthermore, such a vibrator may be applied to an electrostatic MEMS element, an electromagnetically driven MEMS element, or a piezoresistive MEMS element.

As further shown, the resonator 10 includes a vibrator 120, a holder 140 (e.g., a frame), and a holding arm 110. For example, the resonator 10 is formed plane-symmetrically with respect to a virtual plane P parallel to a YZ plane. That is, the shapes of the vibrator 120, the holder 140, and the holding arm 110 are substantially plane-symmetrical with respect to the virtual plane P as a plane of symmetry.

The vibrator 120 is provided inside the holder 140. A space is formed at a predetermined interval between the vibrator 120 and the holder 140. In the example illustrated in FIG. 3, the vibrator 120 has a proximal portion 130 and four vibrating arms 135A to 135D (hereinafter also collectively referred to as "vibrating arms 135"). The number of vibrating arms is not limited to four and is set to, for example, any number of three or more. In the present embodiment, the vibrating arms 135A to 135D and the proximal portion 130 are integrally formed.

The proximal portion 130 has long sides 131*a* and 131*b* extending in the X-axis direction and short sides 131*c* and 131*d* extending in the Y-axis direction when the upper surface of the resonator 10 is viewed in a plan view (hereinafter simply referred to as "in plan view"). The long side 131*a* is a side of a front end surface of the proximal portion 130 (hereinafter also referred to as a "front end surface 131A"). The long side 131*b* is a side of a rear end surface of the proximal portion 130 (hereinafter also referred to as a "rear end surface 131B"). The short side 131*c* is a side of one lateral end surface of the proximal portion 130 (hereinafter also referred to as a "left end surface 131C"). The short side 131*d* is a side of the other lateral end surface of the proximal portion 130 (hereinafter also referred to as a "right end surface 131D"). In the proximal portion 130, the front end surface 131A and the rear end surface 131B are provided so as to be opposite to each other, and the left end surface 131C and the right end surface 131D are provided so as to be opposite to each other.

According to the exemplary aspect, the proximal portion 130 is connected to the vibrating arms 135 at the front end surface 131A, and is connected to a holding arm 110 (described later) at the rear end surface 131B. Midpoints of the long sides 131*a* and 131*b* are located on the virtual plane P. Although the proximal portion 130 has a substantially rectangular shape in plan view in the example illustrated in FIG. 3, the shape is not limited thereto. The proximal portion 130 may be formed in any shape as long as the shape is substantially plane-symmetrical with respect to the virtual plane P. For example, the proximal portion 130 may have a trapezoidal shape in which the long side 131*b* is shorter than the long side 131*a*, or may have a semicircular shape in which the long side 131*a* is a diameter. Each surface of the proximal portion 130 is not limited to a flat surface, and may be a curved surface.

In the proximal portion 130, a proximal-portion length that is the largest distance between the front end surface 131A and the rear end surface 131B in a direction from the front end surface 131A to the rear end surface 131B is about 35 μm. A proximal-portion width that is the largest distance between the lateral ends of the proximal portion 130 in a width direction orthogonal to the proximal-portion length direction is about 265 μm.

Moreover, the vibrating arms 135 extend in the Y-axis direction and have the same size. Each of the vibrating arms 135 is disposed between the proximal portion 130 and the holder 140 in parallel to the Y-axis direction, and has one end connected to the front end surface 131A of the proximal portion 130 to be a fixed end, and the other end that is an open end. The vibrating arms 135 are provided side by side at a predetermined interval in the X-axis direction. The vibrating arms 135 each have, for example, a width in the X-axis direction (hereinafter, simply referred to as a "width") of about 50 μm and a length in the Y-axis direction (hereinafter, simply referred to as a "length") of about 450 μm according to an exemplary aspect.

For example, the width of a portion of about 150 μm in the Y-axis direction from the open end of each of the vibrating arms 135 is larger than the width of the other portion of the vibrating arm 135. This widened portion is referred to as a weight portion G. For example, the weight portion G protrudes from the other portion of each of the vibrating arms 135 to the left and right in the X-axis direction by 10 μm each. For example, the width of the weight portion G is about 70 μm. The weight portion G is integrally formed with the vibrating arm 135 by the same process. Since the weight portion G is formed, the weight per unit length of the vibrating arm 135 is larger on an open end side than on a fixed end side. Thus, since each of the vibrating arms 135 has the weight portion G on the open end side, the amplitude of vibration in an up-down direction in the vibrating arm can be increased.

A protective film 235 (described below) is formed on an upper surface (a surface facing the upper lid 30) of the vibrator 120 so as to cover the entire surface of the upper surface. A frequency adjustment film 236 is formed on an upper surface of the protective film 235 at a distal end on the open end side of each of the vibrating arms 135A to 135D. The frequency adjustment film 236 is provided, for example, on substantially the entire surface on an upper surface side of the weight portion G. The resonant frequency of the vibrator 120 can be adjusted by removal processing of trimming the protective film 235 and the frequency adjustment film 236 from an upper surface side.

The holder 140 (or frame) is formed in a rectangular frame shape so as to surround an outer side portion of the vibrator 120 along the XY plane. The holder 140 has a front frame body 141*a* provided on a positive side in the Y-axis direction of the vibrator 120, a rear frame body 141*b* provided on a negative side in the Y-axis direction of the vibrator 120, a left frame body 141*c* provided on a negative side in the X-axis direction of the vibrator 120, and a right frame body 141*d* provided on a positive side in the X-axis direction of the vibrator 120. It is noted that the shape of the holder 140 is not limited to the frame shape as long as the holder 140 is provided at least partially in the periphery of the vibrator 120.

The holding arm 110 is provided inside the holder 140 and connects the vibrator 120 and the holder 140 to each other. The holding arm 110 holds the vibrator 120 so that the proximal portion 130 can perform the out-of-plane bending vibration. The holding arm 110 includes a left holding arm 110*a* and a right holding arm 110*b*. For example, one end of the left holding arm 110*a* is connected to the rear end surface 131B of the proximal portion 130, and the other end of the left holding arm 110*a* is connected to the left frame body 141*c* of the holder 140. One end of the right holding arm 110*b* is connected to the rear end surface 131B of the proximal portion 130, and the other end of the right holding arm 110*b* is connected to the right frame body 141*d* of the holder 140. The width of a portion of each of the left holding arm 110*a* and the right holding arm 110*b* connected to the proximal portion 130 is smaller than the width of the proximal portion 130.

Next, a stack structure of the resonance device 1 according to an embodiment of the present invention will be described with reference to FIG. 4. In particular, FIG. 4 is a cross-sectional view schematically illustrating a structure of a cross section taken along line IV-IV of the resonance device 1 illustrated in FIG. 1.

Figure 4:
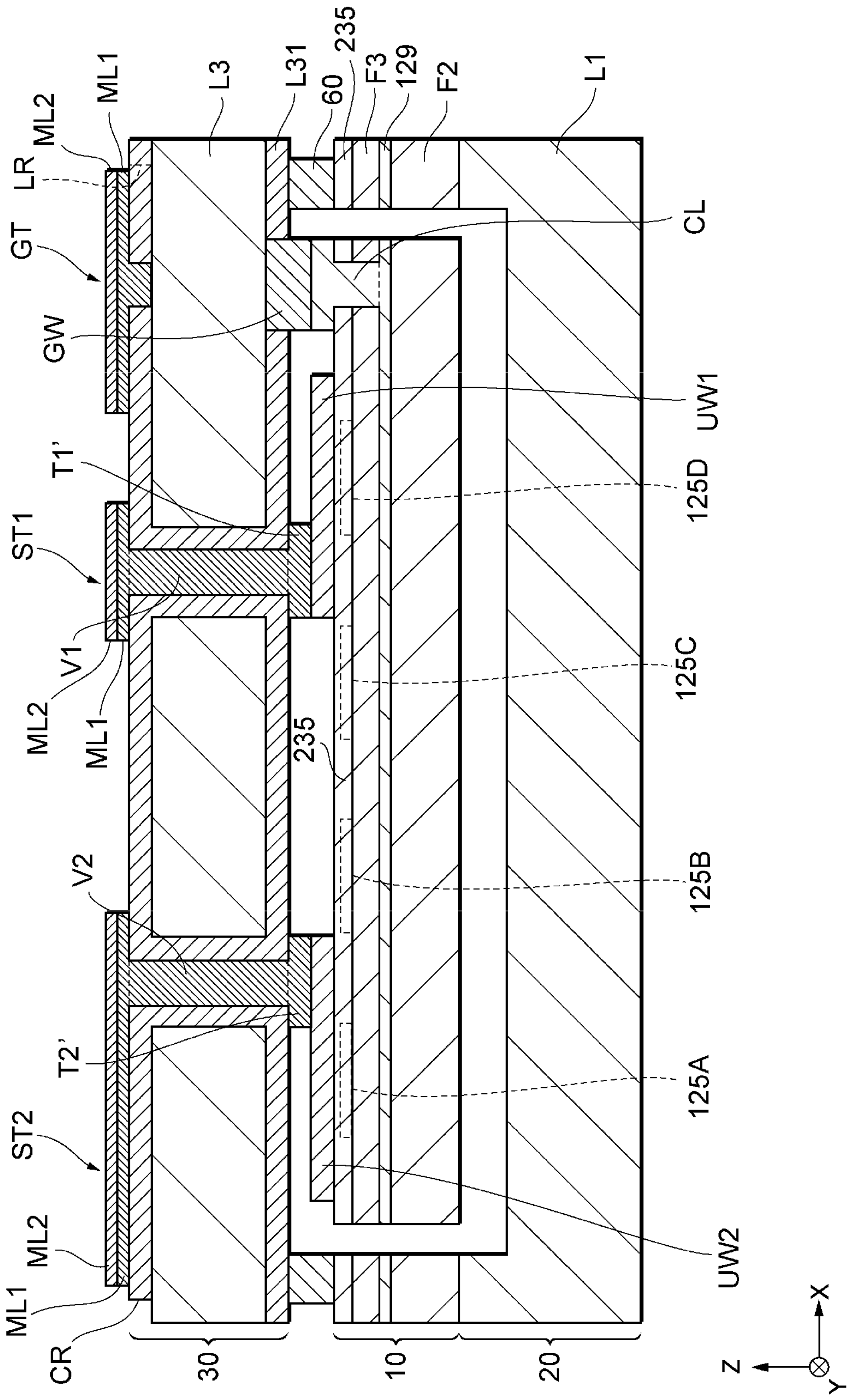
FIG. 4 is a cross-sectional view schematically illustrating a structure of a cross section taken along line IV-IV of the resonance device illustrated in FIG. 1.

As illustrated in FIG. 4, in the resonance device 1, the resonator 10 is bonded onto the lower lid 20, and the resonator 10 and the upper lid 30 are further bonded to each other. In this way, the resonator 10 is held between the lower lid 20 and the upper lid 30, and the lower lid 20, the upper lid 30, and the holder 140 of the resonator 10 form the vibration space in which the vibrator 120 vibrates.

The lower lid 20 is integrally formed of a silicon (Si) wafer (hereinafter referred to as a "Si wafer") L1. The thickness of the lower lid 20 defined in the Z-axis direction is, for example, about 150 μm. The Si wafer L1 is formed using silicon that is not degenerated, and has a resistivity of, for example, 16 mΩ·cm or more.

In an exemplary aspect, the holder 140, the proximal portion 130, the vibrating arms 135, and the holding arm 110 in the resonator 10 can be integrally formed in the same process. In the resonator 10, a lower electrode 129 is formed on a silicon (Si) substrate (hereinafter referred to as a "Si substrate") F2 as an example of a substrate so as to cover an upper surface of the Si substrate F2. A piezoelectric thin film F3 is formed on the lower electrode 129 so as to cover the lower electrode 129. Four upper electrodes 125A, 125B, 125C, and 125D (hereinafter also collectively referred to as "upper electrodes 125") are stacked on the piezoelectric thin film F3. Moreover, a protective film 235 is stacked on the upper electrodes 125 so as to cover the upper electrodes 125. A conductive layer CL and upper wires UW1 and UW2 are provided on the protective film 235 so as to be electrically isolated from each other.

The lower electrode 129 is formed substantially entirely on the upper surface of the Si substrate F2 and extends to an outer edge of the resonator 10. Accordingly, in a state of a collective board 100 (described below) before singulation (e.g., chip formation), lower electrodes 129 of adjacent resonance devices 1 are connected to each other, so that lower electrodes 129 of a plurality of resonance devices 1 can be electrically connected to each other.

The Si substrate F2 may be formed of, for example, a degenerated n-type silicon (Si) semiconductor having a thickness of about 6 μm. Degenerate silicon (Si) can contain phosphorus (P), arsenic (As), antimony (Sb), or the like, as an n-type dopant. The resistance value of the degenerate silicon (Si) used for the Si substrate F2 is, for example, less than 16 mΩ·cm, and more preferably 1.2 mΩ·cm or less. As an example of a temperature characteristics correction layer, a silicon oxide (for example, $SiO_2$) layer may be formed on at least one of the upper surface and a lower surface of the Si substrate F2.

As described above, since the Si substrate F2 is made of degenerate silicon (Si), for example, by using a degenerate silicon substrate having a low resistance value, the Si substrate F2 itself can also serve as a lower electrode, and the lower electrode 129 can be omitted. In this case, by sharing the Si substrate F2 between adjacent resonance devices 1 in the state of the collective board 100, Si substrates F2, that is, lower electrodes of a plurality of resonance devices 1 can be electrically connected to each other.

The lower electrode 129 and the upper electrodes 125 have a thickness of, for example, about 0.1 μm or more and 0.2 μm or less, and are patterned into a desired shape by etching or the like. The lower electrode 129 and the upper electrodes 125 are made of a metal whose crystal structure is a body-centered cubic structure. Specifically, the lower electrode 129 and the upper electrodes 125 are formed using molybdenum (Mo), tungsten (W), or the like.

The piezoelectric thin film F3 is a thin film of a piezoelectric body that converts electrical energy into mechanical energy, and converts mechanical energy into electrical energy. For example, the piezoelectric thin film F3 can be formed using a material having a wurtzite-type hexagonal crystal structure, and may contain, as a main component, a nitride or an oxide, such as aluminum nitride (AlN), scandium aluminum nitride (ScAlN), zinc oxide (ZnO), gallium nitride (GaN), or indium nitride (InN). Scandium aluminum nitride is aluminum nitride in which part of aluminum is substituted with scandium, and may be substituted with two elements such as magnesium (Mg) and niobium (Nb) or magnesium (Mg) and zirconium (Zr) instead of scandium. The piezoelectric thin film F3 has a thickness of, for example, 1 μm, but can have a thickness of about 0.2 μm or more and 2 μm or less.

In operation, the piezoelectric thin film F3 expands and contracts in the Y-axis direction among in-plane directions of the XY plane in accordance with an electric field that is applied to the piezoelectric thin film F3 by the lower electrode 129 and the upper electrodes 125. Due to the expansion and contraction of the piezoelectric thin film F3, the vibrating arms 135 displace their free ends toward inner surfaces of the lower lid 20 and the upper lid 30, and vibrate in the out-of-plane bending vibration mode.

In the present embodiment, a phase of an electric field that is applied to the upper electrodes 125A and 125D of the outer vibrating arms 135A and 135D and a phase of an electric field that is applied to the upper electrodes 125B and 125C of the inner vibrating arms 135B and 135C are set to be opposite to each other. Accordingly, the outer vibrating arms 135A and 135D and the inner vibrating arms 135B and 135C are displaced in directions opposite to each other. For example, when the outer vibrating arms 135A and 135D displace the free ends toward the inner surface of the upper lid 30, the inner vibrating arms 135B and 135C displace the free ends toward the inner surface of the lower lid 20. Accordingly, a first rotation moment is generated around a rotation axis extending in the Y-axis direction between the outer vibrating arm 135A and the inner vibrating arm 135B. In addition, a second rotation moment in a direction opposite to the direction of the first rotation moment is generated around a rotation axis extending in the Y-axis direction between the outer vibrating arm 135D and the inner vibrating arm 135C. The first and second rotation moments also act on the proximal portion 130. The proximal portion 130 displaces the left end surface 131C and the right end surface 131D thereof toward the inner surfaces of the lower lid 20 and the upper lid 30, and vibrates in the out-of-plane bending vibration mode.

The protective film 235 prevents oxidation of the upper electrodes 125 and is preferably formed of a material whose mass reduction rate by etching is lower than that of the frequency adjustment film 236. The mass reduction rate is represented by an etching rate of a material, that is, the product of the thickness by which the material is removed per unit time and the density of the material. The protective film 235 is formed of, for example, a piezoelectric film made of aluminum nitride (AlN), scandium aluminum nitride (ScAlN), zinc oxide (ZnO), gallium nitride (GaN), indium nitride (InN), or the like, or an insulating film made of silicon nitride (SiN), silicon oxide ($SiO_2$), alumina oxide ($Al_2O_3$), or the like. The thickness of the protective film 235 is, for example, about 0.2 μm.

The frequency adjustment film 236 is formed on substantially the entire surface of the vibrator 120 and is then formed only in a predetermined region by processing such as etching. The frequency adjustment film 236 is formed of a material whose mass reduction rate by etching is higher than that of the protective film 235. Specifically, the frequency adjustment film 236 is formed using a metal, such as molybdenum (Mo), tungsten (W), gold (Au), platinum (Pt), nickel (Ni), or titanium (Ti).

As long as the relationship between the mass reduction rates of the protective film 235 and the frequency adjustment film 236 is as described above, the magnitude relationship between the etching rates may be desirably determined.

The conductive layer CL is formed to be in contact with the lower electrode 129. Specifically, the piezoelectric thin film F3 and the protective film 235 stacked on the lower electrode 129 are partially removed to form a via so that the lower electrode 129 is exposed to connect the conductive layer CL and the lower electrode 129 to each other. The via is filled with a material similar to that of the lower electrode 129, and the lower electrode 129 and the conductive layer CL are connected to each other.

As further illustrated in FIG. 4, the upper wire UW1 is electrically connected to the upper electrodes 125B and 125C of the inner vibrating arms 135B and 135C using a lower wire (not illustrated) (a lower wire LW1, described below). The upper wire UW2 is electrically connected to the upper electrodes 125A and 125D of the outer vibrating arms 135A and 135D using a lower wire (not illustrated) (a lower wire LW21 and LW22, described below). The upper wires UW1 and UW2 are formed using a metal, such as aluminum (Al), gold (Au), or tin (Sn).

A bonding portion 60 is formed in a substantially rectangular ring shape along the XY plane between the resonator 10 and the upper lid 30. The bonding portion 60 bonds the MEMS substrate 50 and the upper lid 30 to each other so as to seal the vibration space of the resonator 10. Accordingly, the vibration space is hermetically sealed, and a vacuum state is maintained.

The bonding portion 60 has conductivity and is formed using, for example, a metal, such as aluminum (Al), germanium (Ge), or an alloy in which aluminum (Al) and germanium (Ge) are bonded by eutectic bonding. Alternatively, the bonding portion 60 may be formed of a gold (Au) film, a tin (Sn) film, or the like, or may be formed of a combination of gold (Au) and silicon (Si), gold (Au) and gold (Au), copper (Cu) and tin (Sn), or the like. To improve adhesion, titanium (Ti), titanium nitride (TiN), tantalum nitride (TaN), or the like, may be thinly interposed between the stacked layers in the bonding portion 60.

The bonding portion 60 is disposed on an upper surface of the MEMS substrate 50 (the lower lid 20 and the resonator 10) at a predetermined distance, for example, about 20 μm from an outer edge. Accordingly, it is possible to suppress a product defect of the resonance device 1 such as a protrusion (burr) or a droop caused by a division defect that may occur when the bonding portion 60 is not spaced apart by the predetermined distance.

The upper lid 30 is formed of a Si wafer L3 having a predetermined thickness. For purposes of this disclosure, the Si wafer L3 corresponds to an example of a "semiconductor substrate". The upper lid 30 is bonded to the resonator 10 by the bonding portion 60 at a peripheral portion (e.g., the side wall 33) of the upper lid 30. In the upper lid 30, it is preferable that the upper surface on which the power supply terminals ST1 and ST2 and the ground terminal GT are provided, a lower surface facing the resonator 10, and side surfaces of through electrodes V1 and V2 are covered with a silicon oxide film L31. The silicon oxide film L31 is formed on surfaces of the Si wafer L3 by, for example, oxidation of the surfaces of the Si wafer L3 or chemical vapor deposition (CVD).

It is noted that the silicon oxide film L31 does not have to cover the entire surface of the upper surface of the upper lid 30, and may be provided at least between the Si wafer L3 and the power supply terminal ST1, between the Si wafer L3 and the power supply terminal ST2, and between the Si wafer L3 and the ground terminal GT. The silicon oxide film L31 on the upper surface of the upper lid 30 corresponds to an example of an "insulating layer".

In an exemplary aspect, the through electrodes V1 and V2 are formed by filling through holes formed in the upper lid 30 with a conductive material. The filled conductive material is, for example, impurity-doped polycrystalline silicon (poly-Si), copper (Cu), gold (Au), impurity-doped monocrystalline silicon, or the like. The through electrode V1 serves as a wire that electrically connects the power supply terminal ST1 and a terminal T1' to each other. The through electrode V2 serves as a wire that electrically connects the power supply terminal ST2 and a terminal T2' to each other.

The power supply terminals ST1 and ST2 and the ground terminal GT are formed on the upper surface (i.e., a surface opposite to a surface facing the resonator 10) of the upper lid 30. The terminals T1' and T2' and a ground wire GW are formed on the lower surface (i.e., the surface facing the resonator 10) of the upper lid 30. The power supply terminal ST1, a through electrode V1, and the terminal T1' are electrically insulated from the Si wafer L3 by the silicon oxide film L31. In contrast, when the upper lid 30 and the resonator 10 are bonded to each other, the terminal T1' and the upper wire UW1 are connected to each other, and hence the power supply terminal ST1 is electrically connected to the upper wire UW1. As described above, since the upper wire UW1 is electrically connected to the upper electrodes 125B and 125C, the power supply terminal ST1 is electrically connected to the upper electrodes 125B and 125C of the resonator 10.

The power supply terminal ST2 is electrically connected to the upper wire UW2 using the through electrode V2 and the terminal T2'. The power supply terminal ST2, the through electrode V2, and the terminal T2' are electrically insulated from the Si wafer L3 by the silicon oxide film L31. In contrast, when the upper lid 30 and the resonator 10 are bonded to each other, the terminal T2' and the upper wire UW2 are connected to each other, and hence the power supply terminal ST2 is electrically connected to the upper wire UW2. As described above, since the upper wire UW2 is electrically connected to the upper electrodes 125A and 125D, the power supply terminal ST2 is electrically connected to the upper electrodes 125A and 125D of the resonator 10.

The ground terminal GT is formed so as to be in contact with the Si wafer L3. Specifically, the silicon oxide film L31 is partially removed by processing such as etching, and the ground terminal GT is formed on the exposed Si wafer L3.

Similarly, the ground wire GW is formed so as to be in contact with the Si wafer L3. Specifically, the silicon oxide film L31 is partially removed by processing such as etching, and the ground wire GW is formed on the exposed Si wafer L3.

The ground terminal GT and the ground wire GW are formed using a metal, such as gold (Au) or aluminum (Al). By performing annealing (heat treatment) on the formed metal, the ground terminal GT and the ground wire GW are brought into ohmic contact with the Si wafer L3. Accordingly, the ground terminal GT and the ground wire GW are electrically connected to each other using the Si wafer L3.

When the upper lid 30 and the resonator 10 are bonded to each other, the ground wire GW and the conductive layer CL are connected to each other, and hence the ground terminal GT is electrically connected to the conductive layer CL. As described above, since the conductive layer CL is electrically connected to the lower electrode 129, the ground terminal GT is electrically connected to the lower electrode 129 of the resonator 10.

As described above, since the ground terminal GT is electrically connected to the lower electrode 129 using the ground wire GW and the conductive layer CL, the ground terminal GT can easily provide (e.g., apply) the reference potential to the resonator 10.

Figure 5:
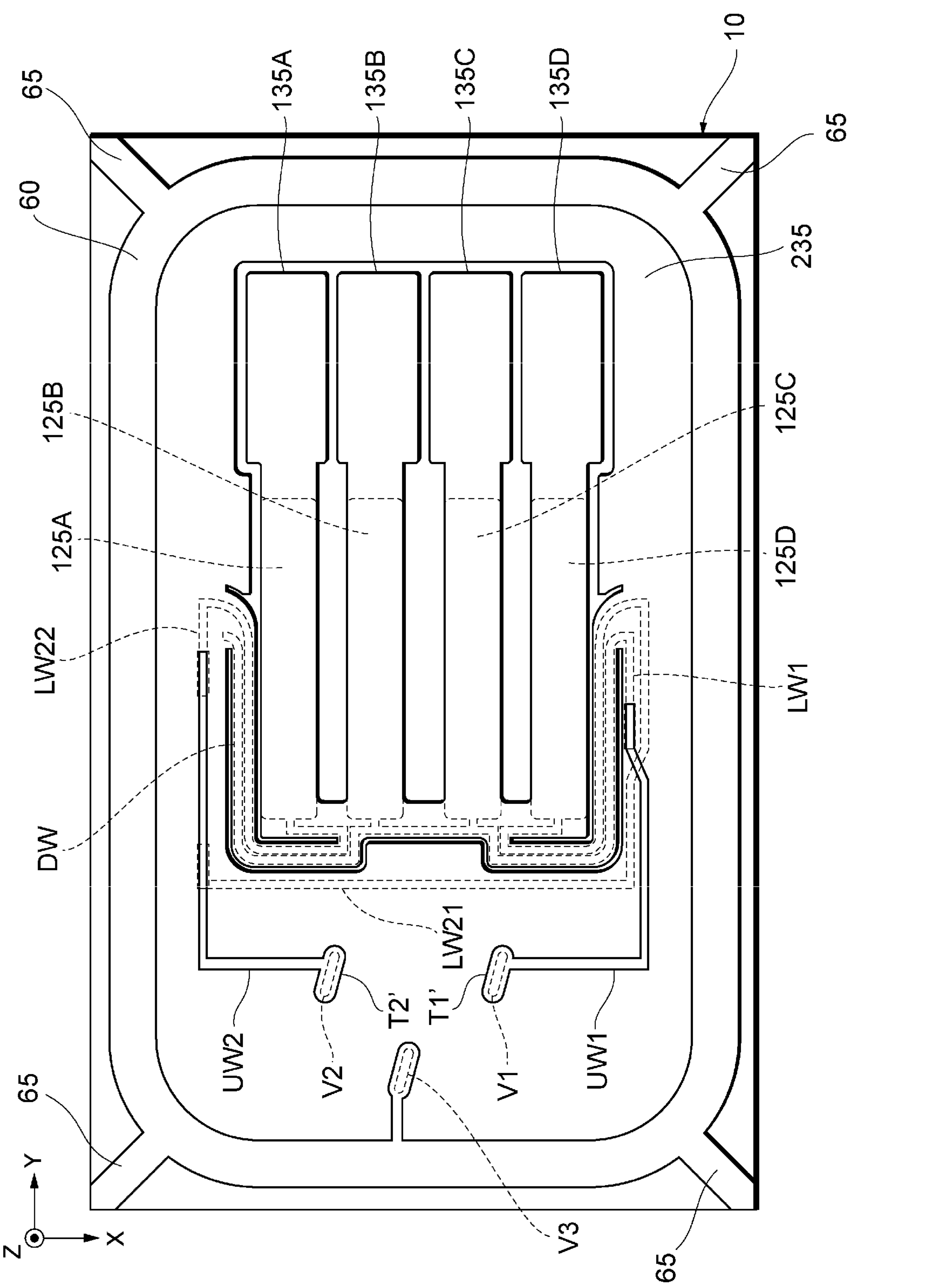
FIG. 5 is a plan view schematically illustrating the resonator illustrated in FIG. 1 and wiring around the resonator.

Next, the resonator 10 in the resonance device 1 according to an exemplary embodiment and wiring around the resonator 10 will be described with reference to FIG. 5. FIG. 5 is a plan view schematically illustrating the resonator illustrated in FIG. 1 and wiring around the resonator.

As illustrated in FIG. 5, the upper electrode 125A is provided on the vibrating arm 135A, the upper electrode 125B is provided on the vibrating arm 135B, the upper electrode 125C is provided on the vibrating arm 135C, and the upper electrode 125D is provided on the vibrating arm 135D. The terminal T1' electrically connects the through electrode V1 formed at the power supply terminal ST1 of the upper lid 30 and the upper wire UW1 formed on the protective film 235 of the resonator 10 to each other. The upper wire UW1 is electrically connected to a lower wire LW1 covered with the protective film 235. The lower wire LW1 is extended and electrically connected to the upper electrode 125B of the vibrating arm 135B and the upper electrode 125C of the vibrating arm 135C.

As described above, the terminal T2' electrically connects the through electrode V2 formed at the power supply terminal ST2 of the upper lid 30 and the upper wire UW2 formed on the protective film 235 of the resonator 10 to each other. Moreover, the upper wire UW2 is electrically connected to lower wires LW21 and LW22 covered with the protective film 235. The lower wire LW21 is extended and electrically connected to the upper electrode 125D of the vibrating arm 135D. Similarly, the lower wire LW22 is extended and electrically connected to the upper electrode 125A of the vibrating arm 135A.

As is apparent from FIG. 5, the upper wire UW1 and the lower wire LW1 electrically connecting the power supply terminal ST1 and the upper electrodes 125B and 125C to each other have an extended length (e.g., a distance) different from an extended length of the upper wire UW2 and the lower wires LW21 and LW22 electrically connecting the power supply terminal ST2 and the upper electrodes 125A and 125D to each other. Thus, the area of the upper wire UW1 and the lower wire LW1 differs from the area of the upper wire UW2 and the lower wires LW21 and LW22.

The lower wire LW1 includes a dummy wire DW in the exemplary aspect that is not electrically connected, but increases the area of the lower wire LW1 while maintaining the symmetry of the lower wire LW1. Accordingly, it is possible to maintain the symmetry of the vibration of the vibrating arms 135, and it is also possible to adjust the imbalance of the capacitance generated by the areas of the upper wire UW1, the lower wire LW1, the upper wire UW2, and the lower wires LW21 and LW22 by the area of the dummy wire DW.

Similarly to the through electrodes V1 and V2, a through electrode V3 is formed by filling a through hole formed in the upper lid 30 with a conductive material. The filled conductive material is, for example, impurity-doped polycrystalline silicon (poly-Si), copper (Cu), gold (Au), impurity-doped monocrystalline silicon, or the like. The through electrode V3 serves as a wire that electrically connects the ground terminal GT formed on the upper surface of the upper lid 30 and the bonding portion 60 formed in a ring shape on the resonator 10 to each other. As described above, the ground terminal GT is connected to the lower electrode 129 and is electrically connected to the bonding portion 60, so that it is possible to reduce the parasitic capacitance that may be generated between the bonding portion 60 and the lower electrode 129 in the stack structure illustrated in FIG. 4.

The bonding portion 60 includes a coupling member 65. For example, the coupling member 65 is formed at a corner portion of the bonding portion 60 and extends to the outer edge of the resonator 10. Accordingly, in the state of the collective board 100 (described below), by connecting coupling members 65 of diagonally disposed resonance devices 1 to each other, lower electrodes 129 can be electrically connected to each other using the coupling members 65.

It is noted that the coupling member 65 is not limited to the coupling member 65 formed at the corner portion of the bonding portion 60. For example, the coupling member 65 may protrude from a long side or a short side of a substantially rectangular shape in a plan view and extend to the outer edge of the resonator 10. In addition, the number of the coupling member(s) 65 included in the bonding portion 60 is not limited to one, and may be two or more.

Figure 6:
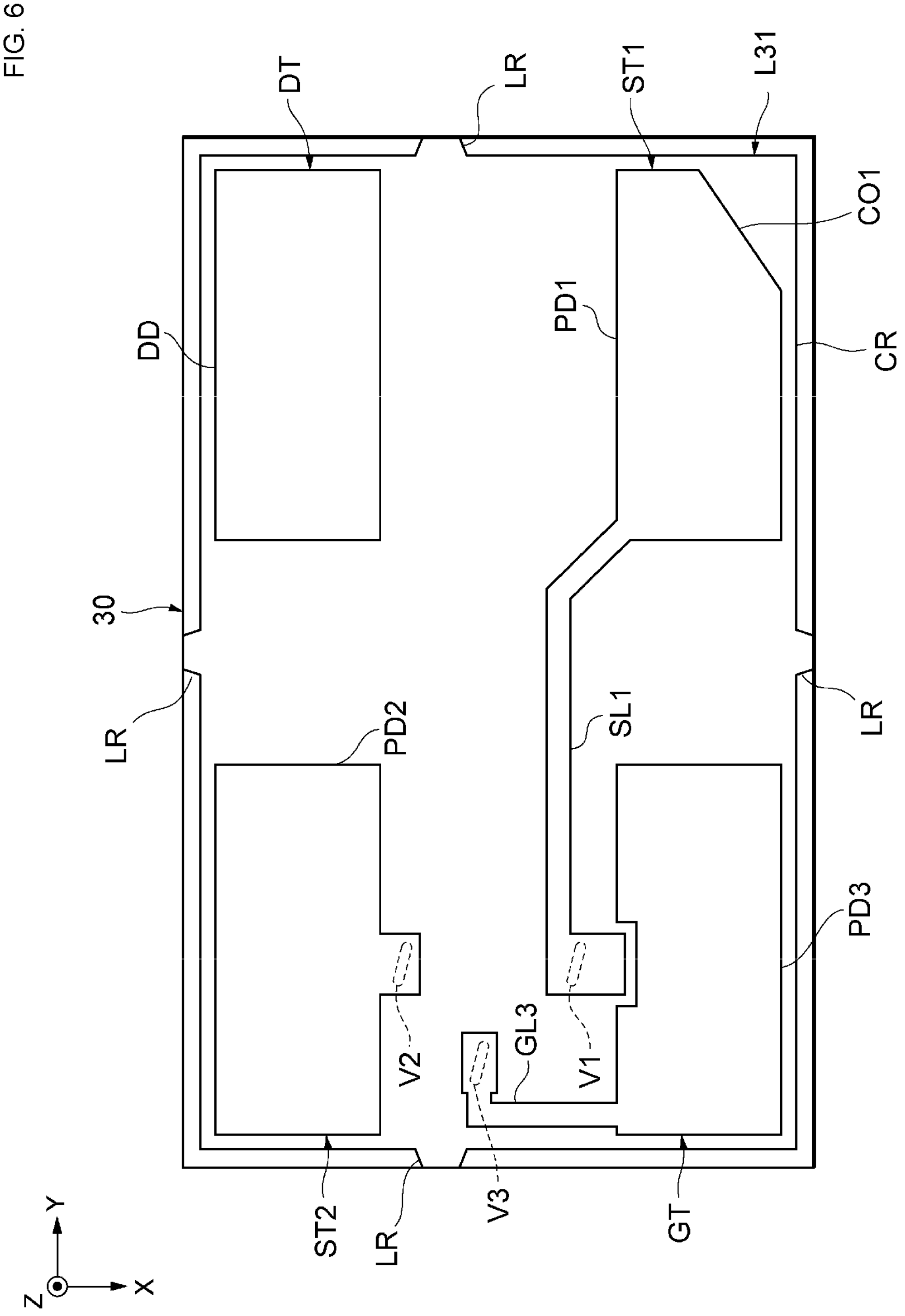
FIG. 6 is a plan view schematically illustrating a structure of an upper lid illustrated in FIG. 1.

Next, a structure on an upper surface side of the upper lid 30 according to an exemplary embodiment will be described with reference to FIG. 6. FIG. 6 is a plan view schematically illustrating a structure of the upper lid illustrated in FIG. 1.

As illustrated in FIG. 6, the power supply terminal ST1 includes a power supply pad PD1 and a power supply wire SL1. The power supply pad PD1 is disposed at a corner portion on the positive side in the X-axis direction and the positive side in the Y-axis direction on the upper surface of the upper lid 30. When the upper surface of the upper lid 30 is viewed in plan view (hereinafter, simply referred to as "in plan view" because the situation is similar to that when the upper surface of the resonator is viewed in plan view), the power supply pad PD1 has a shape including a cutout CO1. One end portion (e.g., a right end portion in FIG. 6) of the power supply wire SL1 is connected to the power supply pad PD1, and the power supply wire SL1 extends to the vicinity of a ground pad PD3 (described below). The above-described through electrode V1 is formed at the other end portion (e.g., a left end portion in FIG. 6) of the power supply wire SL1.

The power supply terminal ST2 includes a power supply pad PD2. The power supply pad PD2 is disposed at a corner portion on the negative side in the X-axis direction and the negative side in the Y-axis direction on the upper surface of the upper lid 30. In plan view, the power supply pad PD2 has a substantially rectangular shape. Moreover, the power supply pad PD2 has a portion protruding on the positive side in the X-axis direction. In this portion, the above-described through electrode V2 is formed.

The ground terminal GT includes a ground pad PD3 and a ground wire GL3. The ground pad PD3 is disposed at a corner portion on the positive side in the X-axis direction and the negative side in the Y-axis direction on the upper surface of the upper lid 30. In plan view, the ground pad PD3 has a substantially rectangular shape. One end portion (e.g., a right end portion in FIG. 6) of the ground wire GL3 is connected to the power supply pad PD3, and the above-described through electrode V3 is formed at the other end portion (e.g., a left end portion in FIG. 6) of the ground wire GL3.

The dummy terminal DT is a terminal that is not electrically connected to the resonator 10. The dummy terminal DT includes only a dummy pad DD. The dummy pad DD is disposed at a corner portion on the negative side in the X-axis direction and the positive side in the Y-axis direction on the upper surface of the upper lid 30. In plan view, the dummy pad DD has a substantially rectangular shape.

As illustrated in FIG. 6, since the power supply terminal ST1 includes the power supply pad PD1 and the power supply wire SL1, whereas the power supply terminal ST2 includes only the power supply pad PD2, the power supply terminal ST1 and the power supply terminal ST2 have different areas. More specifically, the area of the power supply terminal ST1 and the area of the power supply terminal ST2 are different from each other so that the capacitance generated between the power supply terminal ST1 and the ground terminal GT approximates the capacitance generated between the power supply terminal ST2 and the ground terminal GT. Accordingly, the absolute value of the difference between the capacitance generated between the power supply terminal ST1 and the ground terminal GT and the capacitance generated between the power supply terminal ST2 and the ground terminal GT decreases. Thus, the imbalance can be suppressed between the capacitance generated between the power supply terminal ST1 and the ground terminal GT and the capacitance generated between the power supply terminal ST2 and the ground terminal GT.

In plan view, the power supply pad PD2 of the power supply terminal ST2 has a substantially rectangular shape, whereas the power supply pad PD1 of the power supply terminal ST1 has a shape including the cutout CO1. As described above, since the shape of the power supply terminal ST1 and the shape of the power supply terminal ST2 are different from each other, the power supply terminal ST1 and the power supply terminal ST2 having different areas can be easily provided. At least one of the power supply pad PD2, the ground pad PD3, and the dummy pad DD may have a shape including a cutout.

In a plan view, the silicon oxide film L31 that is the example of the "insulating layer" according to the present disclosure has a central region CR spaced apart from the upper lid 30 and a coupling region LR extending from the central region CR and reaching an outer edge of the upper lid 30. The central region CR overlaps the entire surfaces of the power supply terminals ST1 and ST2, the ground terminal GT, and the dummy terminal DT. The coupling region LR is provided on an extension of a region between the power supply pad PD1 of the power supply terminal ST1, the power supply pad PD2 of the power supply terminal ST2, the ground pad PD3 of the ground terminal GT, and the dummy pad DD of the dummy terminal DT. The area of the coupling region LR is smaller than the area of the central region CR. The width in a direction orthogonal to an extending direction of the coupling region LR (hereinafter, simply referred to as a "width") is smaller than the width of each of the pads PD1, PD2, PD3, and DD and is smaller than the width of a region between adjacent terminals. Moreover, the width of the coupling region LR may be at least a width equal to or larger than the width of coupling wires LL1 and LL2 (described later), and preferably as small as possible. In the state of the collective board 100 (described below), coupling regions LR of adjacent resonance devices 1 are continuous.

According to an exemplary aspect, the "insulating layer" can be a multilayer film that includes a plurality of insulating films. In the case of such a multilayer film, at least one insulating film may be spaced apart from the outer edge of the upper lid 30, and the other insulating films may extend to the outer edge of the upper lid 30.

<Collective Board>

Figure 7:
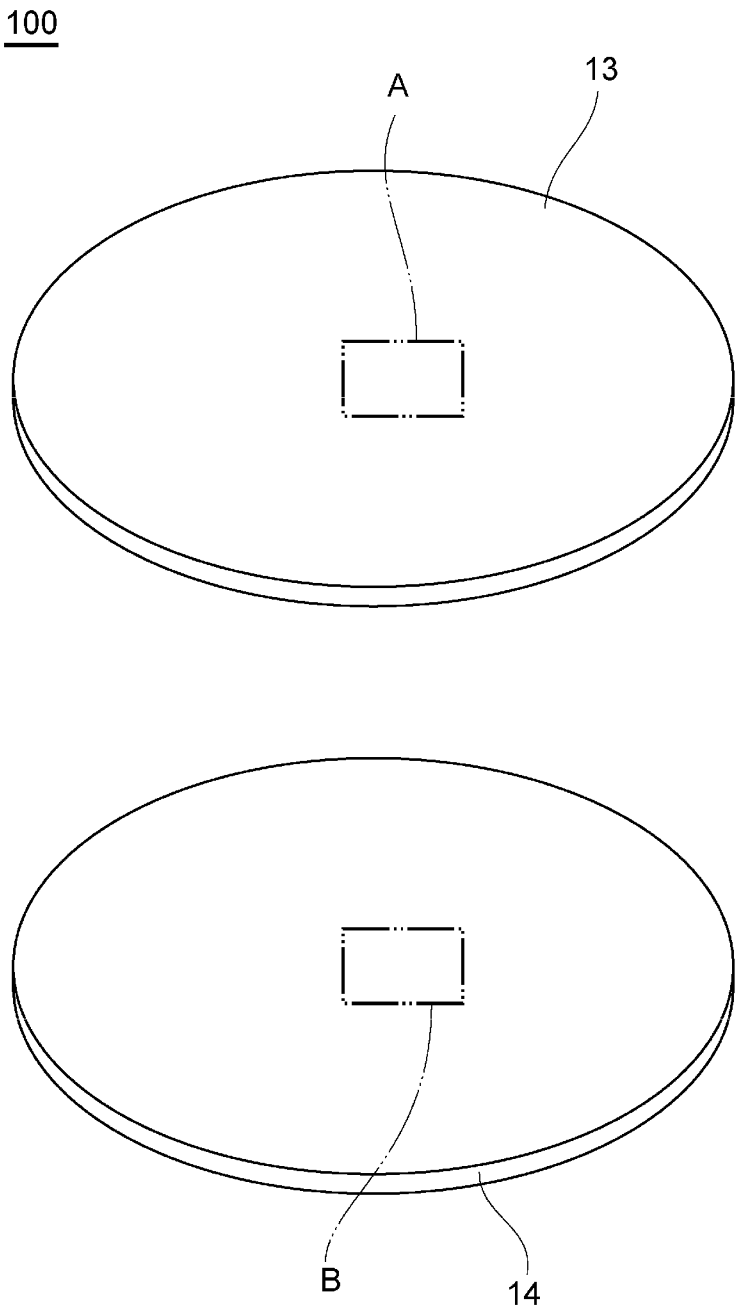
FIG. 7 is an exploded perspective view schematically illustrating an external appearance of a collective board according to an exemplary embodiment.
Figure 8:
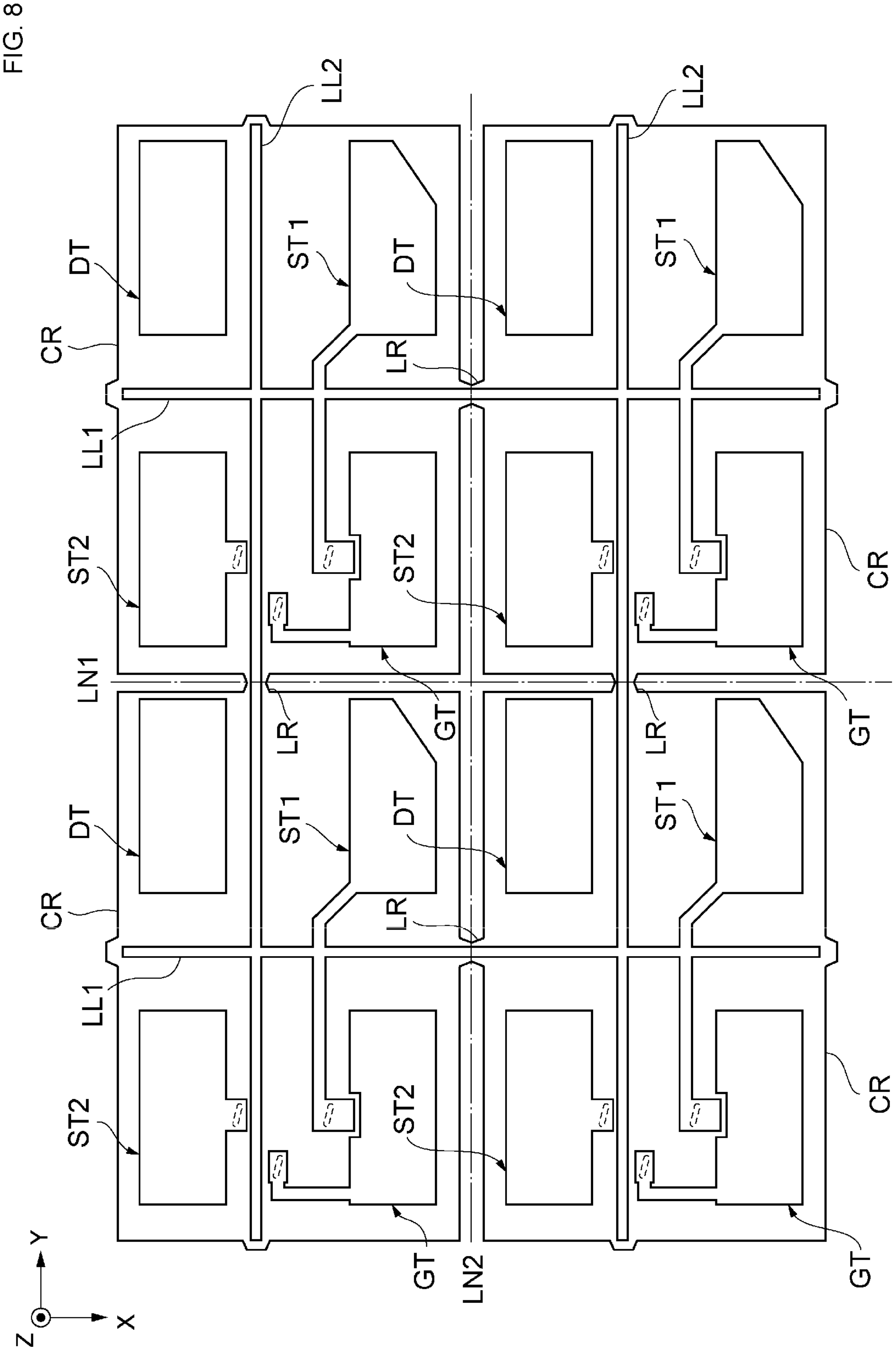
FIG. 8 is a partially enlarged view of an area A illustrated in FIG. 7.
Figure 9:
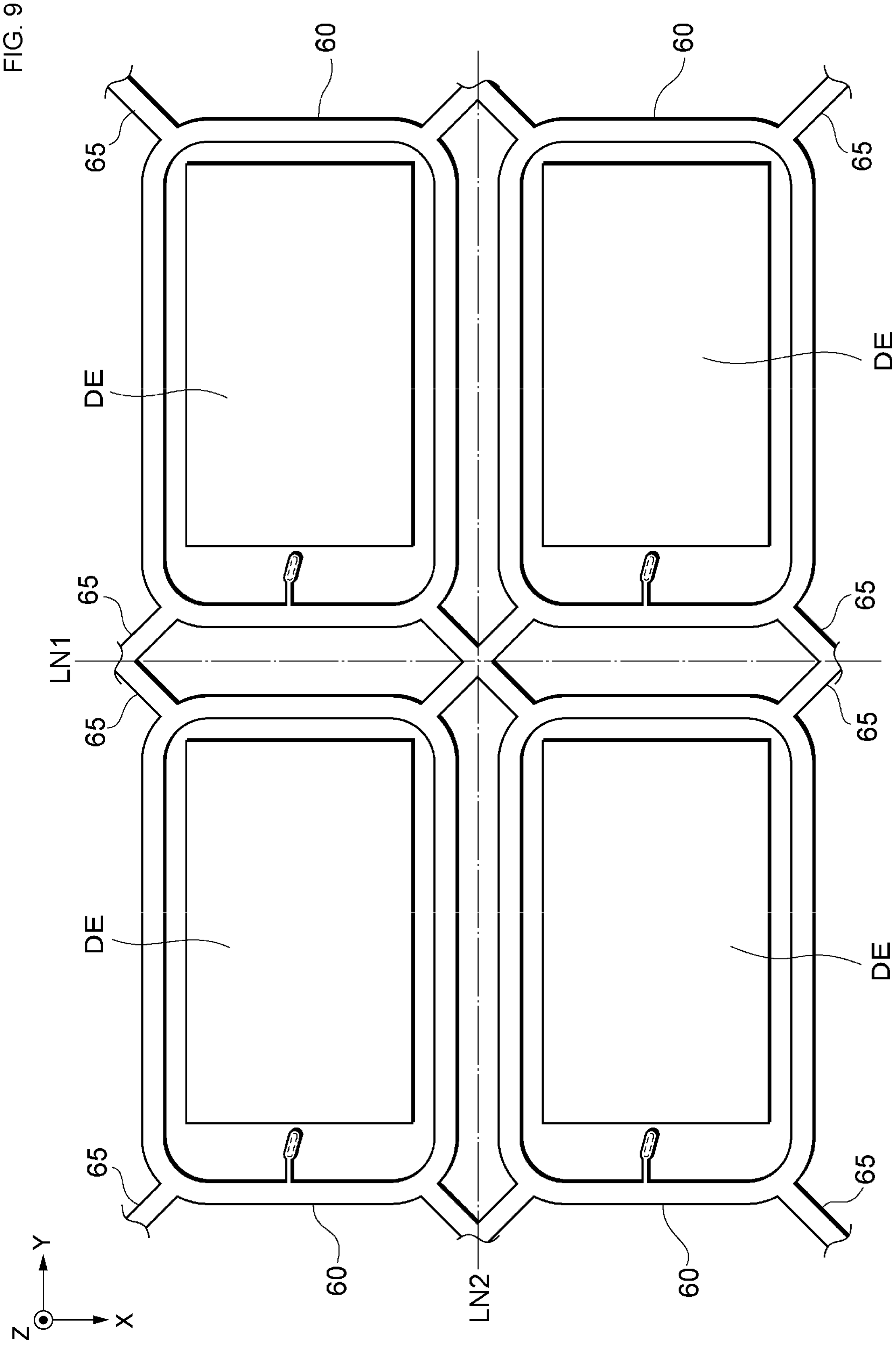
FIG. 9 is a partially enlarged view of an area B illustrated in FIG. 7.

Next, a schematic configuration of the collective board 100 according to an exemplary embodiment will be described with reference to FIGS. 7 to 9. FIG. 7 is an exploded perspective view schematically illustrating an external appearance of the collective board 100 according to the embodiment. FIG. 8 is a partially enlarged view of an area A illustrated in FIG. 7. FIG. 9 is a partially enlarged view of an area B illustrated in FIG. 7. A division line LN1 illustrated in FIG. 8 corresponds to a division line LN1 illustrated in FIG. 9, and a division line LN2 illustrated in FIG. 8 corresponds to a division line LN2 illustrated in FIG. 9.

According to an exemplary aspect, the collective board 100 is used to manufacture the above-described resonance device 1. As illustrated in FIG. 7, the collective board 100 includes an upper substrate 13 and a lower substrate 14. Each of the upper substrate 13 and the lower substrate 14 has a circular shape in plan view. The lower substrate 14 includes a plurality of resonators 10. The upper substrate 13 is disposed so that a lower surface thereof faces the lower substrate 14 with the plurality of resonators 10 interposed therebetween. For purposes of this disclosure, the lower substrate 14 corresponds to an example of a "first substrate", and the upper substrate 13 corresponds to an example of a "second substrate".

As illustrated in FIG. 8, a plurality of power supply terminals ST1 and ST2, a plurality of ground terminals GT, and a plurality of dummy terminals DT are formed on an upper surface of the upper substrate 13. Sets each including four terminals, that is, the power supply terminal ST1, the power supply terminal ST2, the ground terminal GT, and the dummy terminal DT are arranged in an array entirely on the upper surface of the upper substrate 13. Specifically, a plurality of such sets are arranged at a predetermined interval in a row direction (e.g., a direction along the Y axis in FIG. 8) and a column direction (e.g., a direction along the X axis in FIG. 8).

A plurality of coupling wires LL1 and LL2 (hereinafter also collectively referred to as "coupling wires LL") are formed on the upper surface of the upper substrate 13. Each coupling wire LL1 is electrically connected to the power supply terminal ST1 and extends in the column direction (i.e., the direction along the X axis in FIG. 8). Each coupling wire LL2 is electrically connected to the coupling wire LL1 and extends in the row direction (i.e., the direction along the Y axis in FIG. 8). The plurality of coupling wires LL are formed of portions of the metal layer ML1 extending from a region covered with the second metal layer ML2. That is, the metal layer ML1 is formed continuously over the plurality of power supply terminals ST1 and ST2, the plurality of ground terminals GT, the plurality of dummy terminals DT, and the plurality of coupling wires LL, and regions of the metal layer ML1 corresponding to the plurality of power supply terminals ST1 and ST2, the plurality of ground terminals GT, and the plurality of dummy terminals DT are covered with the metal layer ML2.

Division lines LN1 and LN2 (hereinafter also collectively referred to as "division lines LN") illustrated in FIG. 8 are for dividing the collective board 100, that is, the upper substrate 13 and the lower substrate 14 into a plurality of resonance devices 1 by cutting or the like, and are also referred to as scribe lines. The width of the division line LN is, for example, 5 μm or more and 20 μm or less in an exemplary aspect.

On the upper surface of the upper substrate 13, each coupling wire LL1 extends beyond the division line LN2 parallel to the Y axis, and each coupling wire LL2 extends beyond the division line LN1 parallel to the X axis. Accordingly, coupling wires LL of adjacent resonance devices 1 are connected to each other in the state of the collective board 100 before singulation (e.g., chip formation), and hence upper electrodes 125B and 125C of a plurality of resonance devices 1 can be electrically connected using the power supply terminal ST1 and the coupling wire LL. Thus, by bringing two probes into contact with the power supply terminal ST1 and the ground terminal GT, the plurality of resonance devices 1 can be collectively energized, and an operation involving energization, such as frequency adjustment or continuity inspection, can be easily performed in a short time.

The coupling region LR of the insulating layer is provided in a portion of the division line LN overlapping the coupling wire LL when seen in plan view, and hence occurrence of a short-circuit defect between the coupling wire LL and the Si wafer L3 can be suppressed. In addition, the Si wafer L3 is exposed outside the portion of the division line LN overlapping the coupling wire LL, and hence it is possible to divide the collective board 100 while avoiding the insulating layer that is more difficult to be cut as compared with the Si wafer L3. Thus, dicing defect can be limited or suppressed.

Although FIG. 8 illustrates the example in which the two types of the coupling wire LL1 and the coupling wire LL2 are formed on the upper surface of the upper lid 30, the exemplary embodiment is not limited thereto. For example, one type or three or more types of coupling wires may be provided. A coupling wire that electrically connects a plurality of power supply terminals ST2 to each other may be provided, or a coupling wire that electrically connects a plurality of ground terminals GT to each other may be provided. When the coupling wire that couples the plurality of power supply terminals ST2 to each other is provided, the operation involving energization in the collective board 100 can be more easily performed in a shorter time. When the coupling wire that couples the plurality of ground terminals GT to each other is provided, even though the coupling member 65 is omitted, the operation involving energization in the collective board 100 can be more easily performed in a shorter time in a simpler manner.

As illustrated in FIG. 9, a plurality of devices DE and a plurality of bonding portions 60 are formed on an upper surface of the lower substrate 14. Each of the devices DE corresponds to major portions of the above-described resonator 10, for example, the vibrator 120 and the holding arm 110. Each of the bonding portions 60 is provided in a region of the holder 140 of the resonator 10. Each of the bonding portions 60 includes the coupling member 65 at each of the corner portions of the rectangular shape. Sets each including the device DE and the bonding portion 60 are arranged in an array entirely on the upper surface of the lower substrate 14. Specifically, a plurality of such sets are arranged at a predetermined interval in a row direction (e.g., a direction along the Y axis in FIG. 9) and a column direction (e.g., a direction along the X axis in FIG. 9).

Each of the coupling members 65 extends beyond the division line LN. That is, among a plurality of adjacent bonding portions 60, the coupling member 65 of a certain bonding portion is coupled to the coupling member 65 of another bonding portion 60 having a corner portion that faces a corner portion of the certain bonding portion. As a result, the plurality of bonding portions 60 are electrically connected to each other by the coupling members 65.

<Manufacturing Method for MEMS Device>

Figure 10:
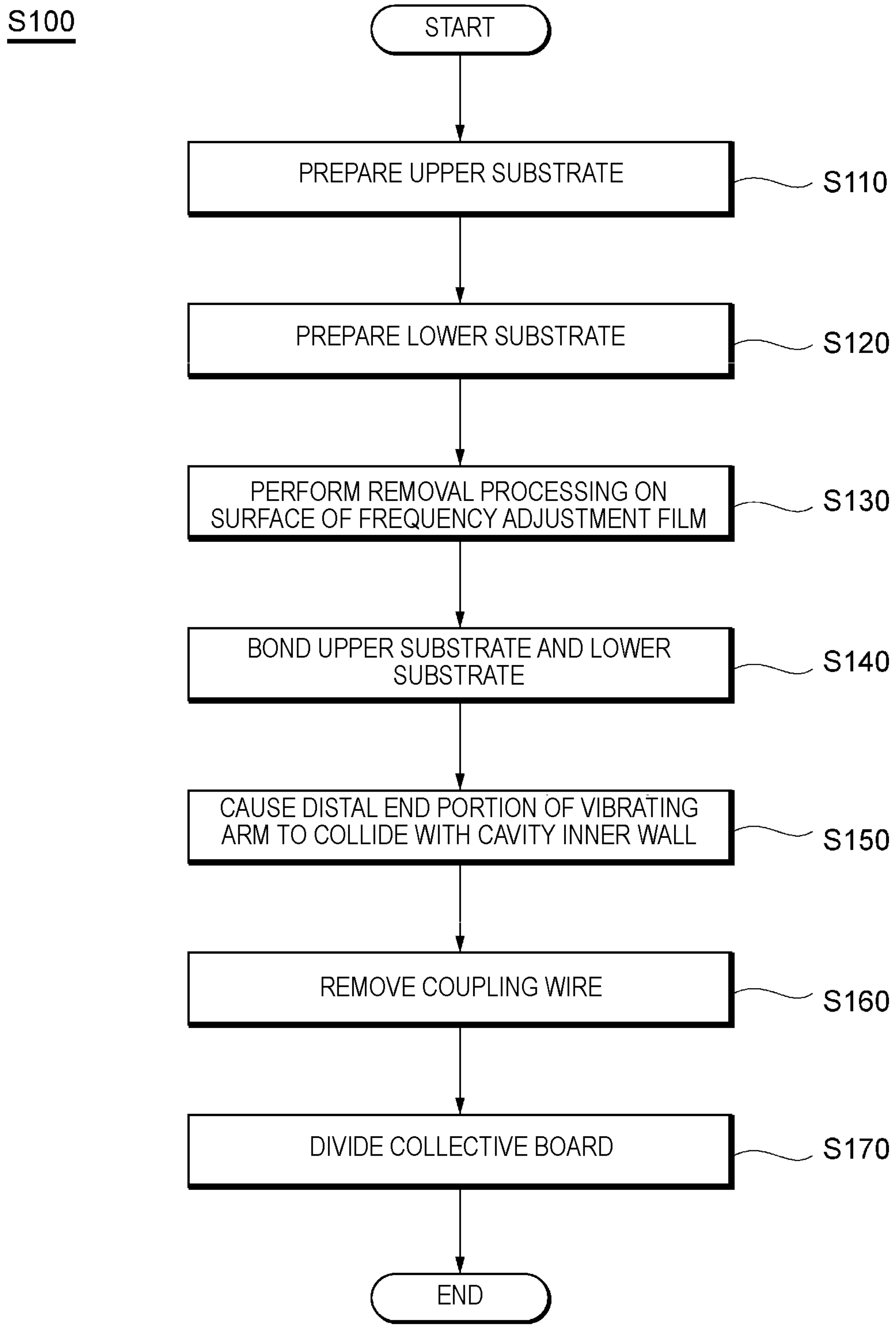
FIG. 10 is a flowchart presenting a manufacturing method for the resonance device according to an exemplary embodiment.
Figure 11:
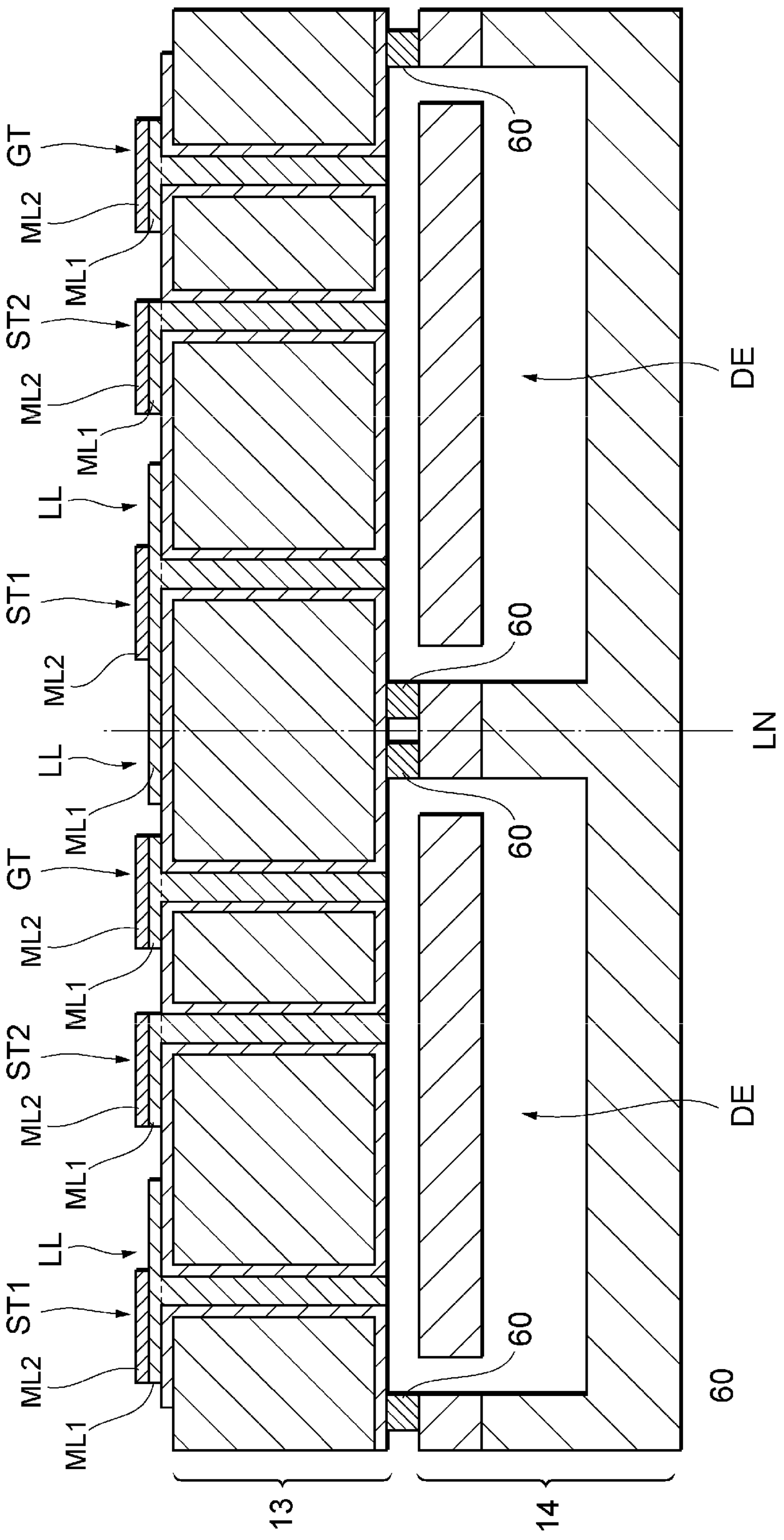
FIG. 11 is a cross-sectional view schematically illustrating a structure of the collective board immediately after an upper substrate and a lower substrate are bonded to each other.
Figure 12:
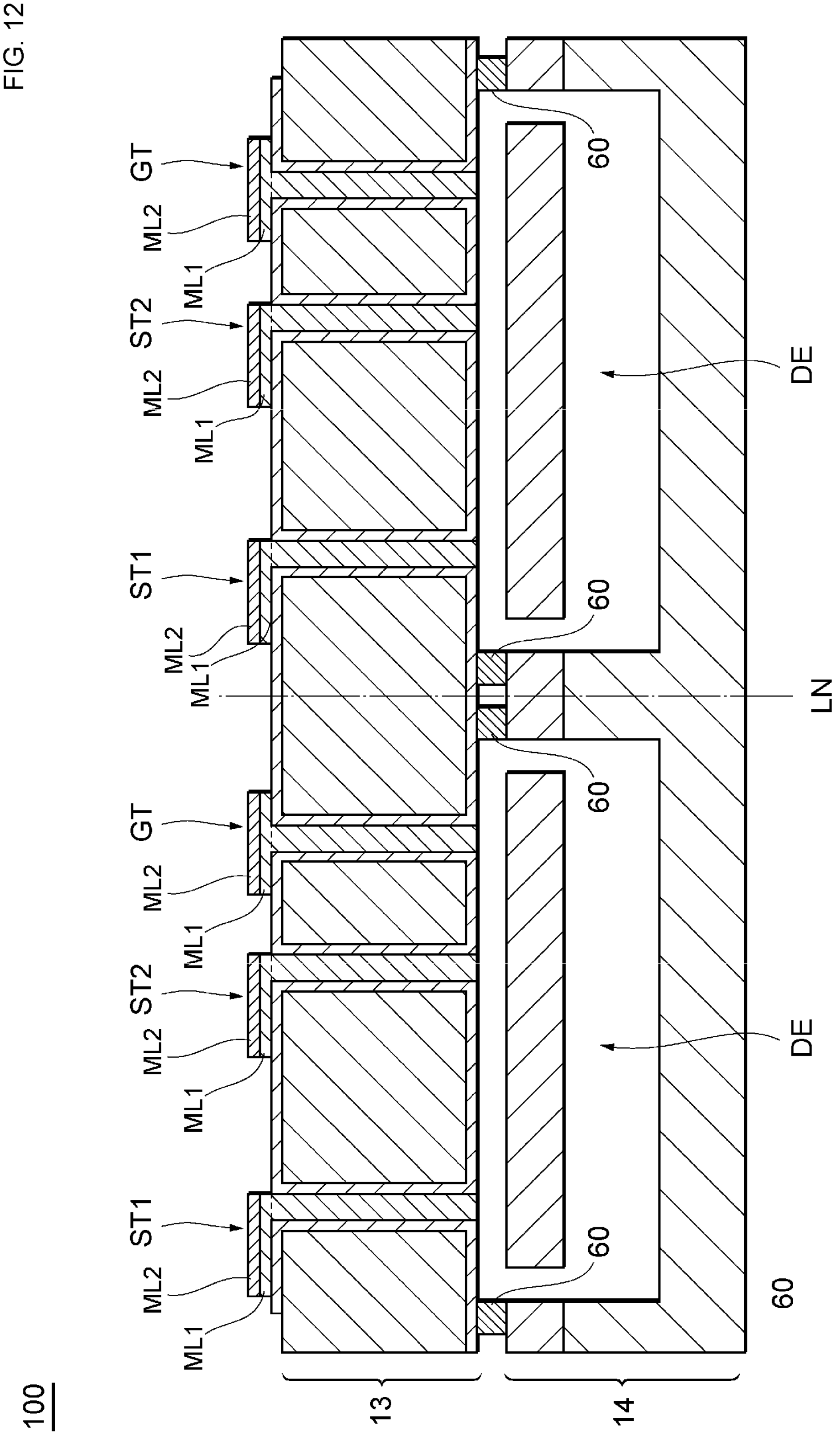
FIG. 12 is a cross-sectional view schematically illustrating a structure of the collective board immediately before division.

Next, a manufacturing method for the resonance device 1 according to an exemplary embodiment will be described with reference to FIGS. 10 to 12. FIG. 10 is a flowchart presenting a manufacturing method S100 for the resonance device 1 according to the embodiment. FIG. 11 is a cross-sectional view schematically illustrating a structure of a collective board immediately after the upper substrate 13 and the lower substrate 14 are bonded to each other. FIG. 12 is a cross-sectional view schematically illustrating a structure of the collective board immediately before division.

As illustrated in FIG. 10, first, the upper substrate 13 corresponding to the upper lid 30 of the resonance device 1 is prepared (S110).

The upper substrate 13 is formed using a Si substrate. Specifically, the upper substrate 13 is formed of the Si wafer L3 illustrated in FIG. 4 and having a certain thickness. An upper surface and a lower surface (i.e., a surface facing the resonator 10) of the Si wafer L3 and side surfaces of the through electrodes V1, V2, and V3 are covered with the silicon oxide film L31. The silicon oxide film L31 is formed on surfaces of the Si wafer L3 by, for example, oxidation of the surfaces of the Si wafer L3 or chemical vapor deposition (CVD).

On the upper surface of the upper substrate 13, the plurality of power supply terminals ST1 and ST2, the plurality of ground terminals GT, the plurality of dummy terminals DT, and the plurality of coupling wires LL are formed. Specifically, the plurality of power supply terminals ST1 and ST2, the plurality of ground terminals GT, and the plurality of dummy terminals DT are formed on the central regions CR of the silicon oxide film L31, and the plurality of coupling wires LL are formed from the central regions CR of the silicon oxide film L31 to the coupling regions LR.

In the step of forming the plurality of power supply terminals ST1 and ST2, the plurality of ground terminals GT, and the plurality of dummy terminals DT, first, the metal layer ML1 serving as a seed film is formed by sputtering in the exemplary aspect. Specifically, a Cu seed is formed on the silicon oxide film L31, and a Ti barrier metal is formed on the Cu seed. Next, the metal layer ML1 (e.g., a seed film) is subjected to electrolytic plating to form the metal layer ML2 that includes a Ni—Au plating film formed by Ni plating and Au plating. The metal layer ML2 is formed in regions to be the plurality of power supply terminals ST1 and ST2, the plurality of ground terminals GT, and the plurality of dummy terminals DT. Next, portions of the metal layer ML1 exposed from the metal layer ML2 other than portions used as the plurality of coupling wires LL are removed by etching. That is, the plurality of coupling wires LL are formed of the first metal layer (e.g., the seed film) extending from a region covered with the second metal layer (e.g., a plating film). As described above, by forming the plurality of coupling wires LL using the step of forming the plurality of power supply terminals ST1 and ST2, the plurality of ground terminals GT, and the plurality of dummy terminals DT, the manufacturing can easily be performed in a short time.

As illustrated in FIG. 8, on the upper surface of the upper substrate 13, each coupling wire LL1 extends beyond the division line LN2 parallel to the Y axis, and each coupling wire LL2 extends beyond the division line LN1 parallel to the X axis. Accordingly, coupling wires LL of adjacent resonance devices 1 are connected to each other in the state of the collective board 100 before singulation (e.g., chip formation), and hence upper electrodes 125B and 125C of a plurality of resonance devices 1 can be electrically connected using the power supply terminal ST1 and the coupling wire LL. The coupling region LR of the silicon oxide film L31 extends along each coupling wire LL beyond the division line LN to prevent a short circuit between the coupling wire LL and the Si wafer L3. The width of the coupling region LR of the silicon oxide film L31 on the division line LN is substantially equal to the width of each coupling wire LL, and the central region CR is spaced apart from the division line LN. Thus, a dicing defect can be suppressed that may otherwise be caused by the silicon oxide film L3 that is more difficult to be cut as compared with the Si wafer L31.

The through electrodes V1 and V2 illustrated in FIG. 4 and the through electrode V3 illustrated in FIG. 5 are formed by filling through holes formed in the upper substrate 13 with a conductive material. The filled conductive material is, for example, impurity-doped polycrystalline silicon (poly-Si), copper (Cu), gold (Au), impurity-doped monocrystalline silicon, or the like.

In contrast, the terminals T1' and T2' and the ground wire GW are formed on the lower surface of the upper substrate 13.

Next, the lower substrate 14 corresponding to the MEMS substrate 50 (i.e., the resonator 10 and the lower lid 20) of the resonance device 1 is prepared (S120).

In the lower substrate 14, Si substrates are bonded to each other. Alternatively, the lower substrate 14 may be formed using an SOI substrate. As illustrated in FIG. 4, the lower substrate 14 includes the Si wafer L1 and the Si substrate F2.

The lower electrode 129, the piezoelectric thin film F3, the upper electrode 125, the protective film 235, and the frequency adjustment film 236 are stacked on the upper surface of the Si substrate F2. The bonding portion 60 is formed on the protective film 235 along the division line LN illustrated in FIG. 9 and at a predetermined distance from the division line LN.

In addition to the upper electrodes 125, the lower wires LW1, LW21, and LW22 and the dummy wire DW are formed on the piezoelectric thin film F3. By using the same kind of metal as the metal of the upper electrodes 125 for the material of the lower wires LW1, LW21, and LW22 and the dummy wire DW, the manufacturing process can be simplified. The conductive layer CL and the upper wires UW1 and UW2 are formed on the protective film 235, in addition to the bonding portion 60. By using the same kind of metal as the metal of the bonding portion 60 for the material of the upper wires UW1 and UW2, the manufacturing process can be simplified.

In the present embodiment, the example is provided in which the bonding portion 60 and the upper wires UW1 and UW2 are formed on an upper surface side of the lower substrate 14. However, in an alternative aspect, at least one of the bonding portion 60 and the upper wires UW1 and UW2 may be formed on a lower surface side of the upper substrate 13. When the bonding portion 60 is formed of a plurality of materials, part of the materials of the bonding portion 60, for example, germanium (Ge) may be formed on the lower surface side of the upper substrate 13, and the remaining part of the materials of the bonding portion 60, for example, aluminum (Al) may be formed on the upper surface side of the lower substrate 14. Similarly, when the upper wires UW1 and UW2 are formed of a plurality of materials, part of the materials of the upper wires UW1 and UW2 may be formed on the lower surface side of the upper substrate 13, and the remaining part of the materials of the upper wires UW1 and UW2 may be formed on the upper surface side of the lower substrate 14.

In the present embodiment, the example is provided in which, after the upper substrate 13 is prepared in step S110, the lower substrate 14 is prepared in step S120. However, in an alternative aspect, the order may be changed so that the upper substrate 13 is prepared after the lower substrate 14 is prepared, or the preparation of the upper substrate 13 and the preparation of the lower substrate 14 may be performed simultaneously.

Next, removal processing is performed on a surface of the frequency adjustment film 236 (S130).

Specifically, the frequency adjustment film 236 of each of the plurality of resonators 10 provided on the lower substrate 14 is trimmed by ion milling to adjust the frequency of the resonator 10 by the change in mass of the vibrating arms 135. At this time, a surface of the protective film 235 may also be trimmed together. For purposes of this disclosure, this step S130 corresponds to an example of a "frequency adjustment step before sealing" or a "first frequency adjustment step".

Next, the upper substrate 13 prepared in step S110 and the lower substrate 14 prepared in step S120 are bonded to each other (S140).

Specifically, as illustrated in FIG. 11, the lower surface of the upper substrate 13 and the upper surface of the lower substrate 14 are bonded by eutectic bonding by the bonding portion 60. As illustrated in FIG. 4, the positions of the upper substrate 13 and the lower substrate 14 are aligned so that the terminals T1' and T2' are in contact with the upper wires UW1 and UW2. After the position alignment, the upper substrate 13 and the lower substrate 14 are sandwiched by a heater or the like, and heat treatment for eutectic bonding is performed. The temperature in the heat treatment for eutectic bonding is the temperature of the confocal point or higher, for example, 424° C. or higher, and the heating time is, for example, about 10 minutes or more and 20 minutes or less. During heating, the upper substrate 13 and the lower substrate 14 are pressed, for example, with a pressure of about 5 MPa or more and 25 MPa or less. In this way, the bonding portion 60 bonds the lower surface of the upper substrate 13 and the upper surface of the lower substrate 14 by eutectic bonding. A series of steps from step S110 to step S140 corresponds to an example of "preparing a collective board" according to the present disclosure.

Next, distal end portions of the vibrating arms 135 are caused to collide with a cavity inner wall (S150).

Specifically, an electric field is applied to the plurality of resonators 10 through the coupling wire LL to simultaneously excite the plurality of resonators 10. At this time, an electric field stronger than the electric field that is applied when the resonators 10 each are normally used as the resonance device 1 is applied to increase the amplitude of the resonators 10 (hereinafter also referred to as "over-excitation"). The vibrating arms 135 of each of the plurality of over-excited resonators 10 collide with the inner wall of the lower lid 20 or the upper lid 30 of the resonator 10, and the distal end portions of the vibrating arms 135 are trimmed. Accordingly, the frequency of the resonator 10 is adjusted by the change in mass of the vibrating arms 135. For purposes of this disclosure, this step S150 corresponds to an example of a "frequency adjustment step after sealing" or a "second frequency adjustment step".

Next, the coupling wire LL is removed (S160).

Specifically, the metal layer ML1 is etched using the metal layer ML2 as a mask. Accordingly, as illustrated in FIG. 12, the metal layer ML1 exposed from the metal layer ML2 is removed, and the metal layer ML1 and the metal layer ML2 remain only in regions corresponding to the power supply terminals ST1 and ST2, the ground terminal GT, and the dummy terminal DT. Accordingly, when the collective board 100 is divided, the occurrence of a short-circuit defect due to deformation of the coupling wire LL can be suppressed. In addition, since it is not necessary to provide a photoresist in the process of removing the coupling wire LL, the manufacturing process is simplified.

Next, the collective board 100 is divided (S170).

Specifically, the upper substrate 13 and the lower substrate 14 are divided along the division line LN. The upper substrate 13 and the lower substrate 14 may be divided by dicing by cutting the upper substrate 13 and the lower substrate 14 using a dicing saw, or by dicing using a stealth dicing technique in which a laser beam is condensed to form a modified layer inside the substrates.

By dividing the upper substrate 13 and the lower substrate 14 along the division line LN in step S170, the upper substrate 13 and the lower substrate 14 are singulated (e.g., chip formation) to each resonance device 1 including the upper lid 30 and the MEMS substrate 50 (i.e., the lower lid 20 and the resonator 10).

Next, modifications of the above-described embodiment will be described. It is noted that components that are the same as or similar to the components illustrated in FIGS. 1 to 12 are denoted by the same or similar reference numerals, and description thereof will be omitted as appropriate. Similar advantageous effects obtained by similar configurations will not be sequentially described.

First Modification

Figure 13:
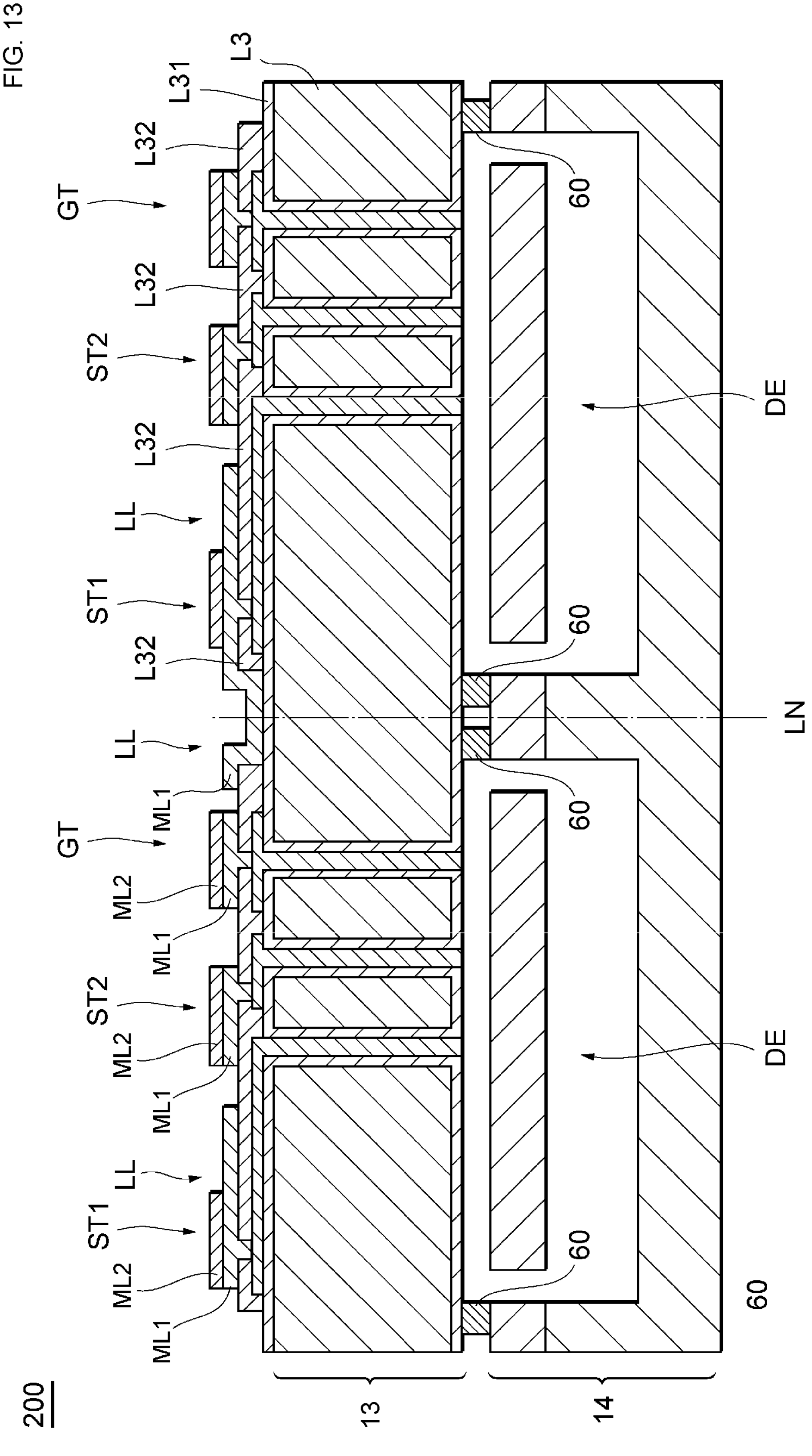
FIG. 13 is a cross-sectional view schematically illustrating a structure of a collective board according to an exemplary embodiment.

A structure of a collective board 200 according to a first modification of the exemplary embodiment will be described with reference to FIG. 13. FIG. 13 is a cross-sectional view schematically illustrating a structure of a collective board according to an embodiment.

As illustrated in FIG. 13, an upper substrate 13 further includes an organic insulating film L32 between the silicon oxide film L31 and the metal layer ML1. For purposes of this disclosure, the silicon oxide film L31 and the organic insulating film L32 together correspond to an example of an "insulating layer". In this aspect, the silicon oxide film L31 extends beyond the division line and is formed substantially entirely on the upper surface of the Si wafer L3. The organic insulating film L32 has a coupling region LR extending beyond the division line LN and a central region CR spaced apart from the division line LN. By forming the insulating layer with two insulating films (i.e., the silicon oxide film L31 and the organic insulating film L32), the power supply terminals ST1 and ST2 can be formed at positions separated from the through electrodes V1 and V2. Thus, the degree of freedom in design is improved.

Second Modification

Figure 14:
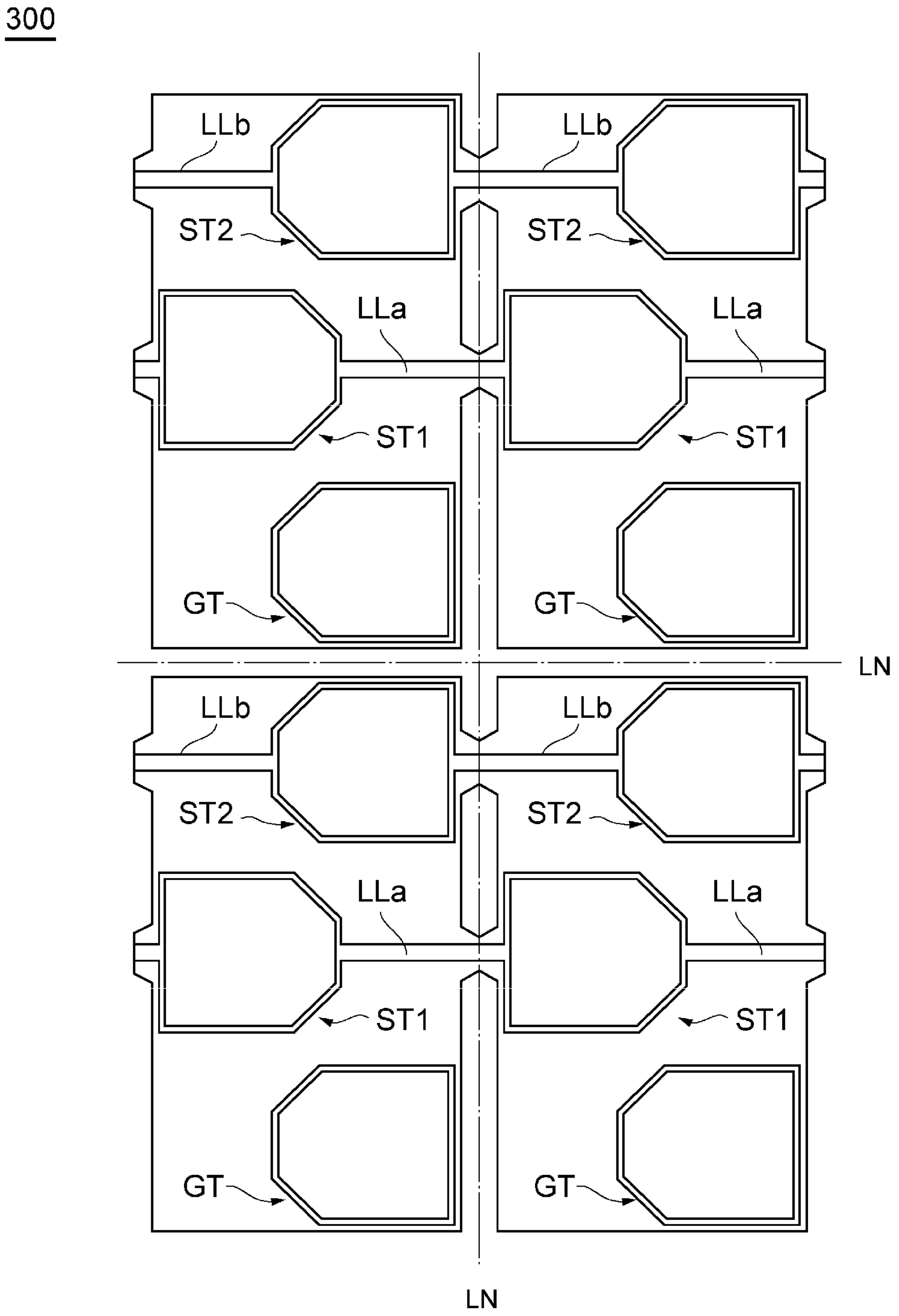
FIG. 14 is a plan view schematically illustrating a structure of a collective board according to an exemplary embodiment.

A structure of a collective board 300 according to a second modification of the exemplary embodiment will be described with reference to FIG. 14. FIG. 14 is a plan view schematically illustrating a structure of a collective board according to an embodiment.

As illustrated in FIG. 14, on an upper substrate of the collective board 300, a coupling wire LLb that electrically connects a plurality of power supply terminals ST2 is formed in addition to a coupling wire LLa that electrically connects a plurality of power supply terminals ST1. The coupling wires Lla and LLb are formed of portions of the first metal film ML1 extending from a region covered with the second metal film ML2. Moreover, the coupling wires LLa and LLb are removed by etching using the second metal film ML2 as a mask before the collective board 300 is divided. In the collective board 300, upper electrodes 125B and 125C of a plurality of resonators can be electrically connected to each other collectively through the power supply terminal ST1 and the coupling wire LLa, and upper electrodes 125A and 125D of the plurality of resonators can be electrically connected to each other collectively through the power supply terminal ST2 and the coupling wire LLb. For purposes of this disclosure, the coupling wire LLa corresponds to an example of a "first coupling wire", and the coupling wire LLb corresponds to an example of a "second coupling wire". The collective board 300 may further include a third coupling wire that electrically connects a plurality of ground terminals GT. Such a third coupling wire is formed of the first metal film ML1 similarly to the coupling wires LLa and LLb, and is removed by etching using the second metal film ML2 as a mask before the collective board 300 is divided.

In general, it is noted that the exemplary embodiments of the present invention have been described above. In particular, a manufacturing method for a resonance device is provided that includes preparing a collective board including a first substrate including a plurality of resonators each including an upper electrode and a lower electrode, and a second substrate bonded on a side of the first substrate close to the plurality of resonators, the collective board including a plurality of first power supply terminals electrically connected to the upper electrodes of the plurality of resonators, and a first coupling wire that electrically connects at least two of the plurality of first power supply terminals; and dividing the collective board into a plurality of resonance devices. In this aspect, the plurality of first power supply terminals are formed by a first metal layer provided on a side of the second substrate opposite to the first substrate, and by a second metal layer covering the first metal layer. Moreover, the first coupling wire includes a portion of the first metal layer extending from a region covered with the second metal layer. The method further includes removing the portion of the first metal layer extending from the region covered with the second metal layer before the dividing the collective board into the plurality of resonance devices.

Accordingly, since the first coupling wire formed beyond a division line is removed when the collective board is divided, occurrence of a short-circuit defect caused by deformation of the first coupling wire due to the division can be suppressed. In addition, before the first coupling wire is removed, a plurality of resonance devices can be collectively energized through the first coupling wire, and an operation involving energization, such as frequency adjustment or continuity inspection, can be easily performed in a short time.

According to an exemplary aspect, the above-described manufacturing method for the resonance device may further include adjusting a frequency of the plurality of resonators. In the above-described manufacturing method for the resonance device, the adjusting the frequency of the plurality of resonators may include applying a voltage to the plurality of resonators through the first coupling wire. Alternatively, this step may include measuring the frequency of the plurality of resonators through the first coupling wire.

According to an exemplary aspect, in the above-described manufacturing method for the resonance device, the first metal layer may include a seed film for providing the second metal layer by plating.

According to an exemplary aspect, in the above-described manufacturing method for the resonance device, the removing the portion of the first metal layer extending from the region covered with the second metal layer may include etching the first metal layer using the second metal layer as a mask.

Accordingly, a photoresist or the like does not have to be provided for etching of removing the first coupling wire, and thus the manufacturing process can be simplified.

According to an exemplary aspect, in the above-described manufacturing method for the resonance device, the second substrate may include a semiconductor substrate, and at least one insulating layer provided between the semiconductor substrate and the first metal layer; and the at least one insulating layer may have a plurality of central regions spaced apart from a division line of the collective board, and a plurality of coupling regions crossing the division line.

Accordingly, the opportunities of dividing the insulating layer that is more difficult to be divided as compared with the semiconductor substrate are reduced, and hence occurrence of a dicing defect can be suppressed.

According to an exemplary aspect, in the above-described manufacturing method for the resonance device, the collective board may be prepared to include a plurality of second power supply terminals electrically connected to the upper electrodes of the plurality of resonators and insulated from the plurality of first power supply terminals, and a second coupling wire that electrically connects at least two of the plurality of second power supply terminals. In this aspect, the plurality of second power supply terminals may include the first metal layer and the second metal layer; and the second coupling wire may include a portion of the first metal layer extending from the region covered with the second metal layer.

Accordingly, the operation involving energization, such as frequency adjustment or continuity inspection, can be more easily performed in a shorter time.

According to an exemplary aspect of the above-described manufacturing method for the resonance device, the collective board may further include a plurality of ground terminals electrically connected to the lower electrodes of the plurality of resonators, and a third coupling wire that electrically connects at least two of the plurality of ground terminals. In this aspect, the plurality of ground terminals may include the first metal layer and the second metal layer; and the third coupling wire may include a portion of the first metal layer extending from the region covered with the second metal layer.

Accordingly, the operation involving energization, such as frequency adjustment or continuity inspection, can be more easily performed in a shorter time.

In another exemplary aspect, a resonance device is provided that includes a first substrate including a resonator including an upper electrode and a lower electrode; and a second substrate bonded on a side of the first substrate close to the resonator. The second substrate includes a semiconductor substrate; a first power supply terminal and a second power supply terminal provided on a side of the semiconductor substrate opposite to the first substrate, electrically connected to a portion of the upper electrode, and insulated from each other; a ground terminal provided on the side of the semiconductor substrate opposite to the first substrate and electrically connected to the lower electrode; and an insulating layer provided between the semiconductor substrate and the first power supply terminal and between the semiconductor substrate and the second power supply terminal. When a side of the second substrate opposite to the first substrate is seen in a plan view, the insulating layer includes a central region spaced apart from an outer edge of the second substrate and a coupling region extending from the central region and reaching the outer edge of the second substrate.

As described above, according to an aspect of the present invention, the resonance device and the manufacturing method for the resonance device are provided with improved productivity.

The exemplary embodiments described above are intended to facilitate understanding of the present invention, and are not intended to limit the interpretation of the present invention. The present invention may be modified or improved without departing from the gist thereof, and equivalents thereof are also included in the present invention. That is, the embodiments and/or the modifications appropriately modified by a person skilled in the art are also included in the scope of the present invention as long as the features of the present invention are included. For example, each element included in the embodiments and/or the modifications and the arrangement, material, condition, shape, size, and the like, thereof are not limited to those illustrated and can be appropriately changed. In addition, the embodiments and the modifications are merely examples, and it is needless to say that partial replacement or combination of configurations illustrated in different embodiments and/or modifications is possible, and these are also included in the scope of the present invention as long as the features of the present invention are included.

REFERENCE SIGNS LIST

1 resonance device
10 resonator
13 upper substrate
14 lower substrate
20 lower lid
30 upper lid
50 MEMS substrate
60 bonding portion
65 coupling member
100 collective board
110 holding arm
120 vibrator
125, 125A, 125B, 125C, 125D upper electrode
129 lower electrode
130 proximal portion
135, 135A, 135B, 135C, 135D vibrating arm
140 holder
235 protective film
236 frequency adjustment film F2 Si substrate
F3 piezoelectric thin film
L1, L3 Si wafer
L31 silicon oxide film
LL, LL1, LL2 coupling wire
LN, LN1, LN2 division line
ST1, ST2 power supply terminal
GT ground terminal
DT dummy terminal

What is claimed is:

1. A resonance device comprising:
a first substrate including a resonator having an upper electrode and a lower electrode; and
a second substrate coupled to a side of the first substrate, the second substrate including:
a semiconductor substrate,
a first power supply terminal and a second power supply terminal on a side of the semiconductor substrate opposite to the first substrate, electrically connected to the upper electrode, and insulated from each other,
a ground terminal on the side of the semiconductor substrate opposite to the first substrate and electrically connected to the lower electrode, and
an insulating layer between the semiconductor substrate and the first power supply terminal and between the semiconductor substrate and the second power supply terminal,
wherein, in a plan view of the second substrate, the insulating layer includes a central region spaced apart from an outer edge of the second substrate and a coupling region extends from the central region to the outer edge of the second substrate.

2. The resonance device according to claim 1, wherein the central region of the insulating layer overlaps an entire surfaces of the first power supply terminal and the second power supply terminal.

3. The resonance device according to claim 1, wherein an area of the coupling region is smaller than an area of the central region.

4. The resonance device according to claim 1, wherein a width in a direction orthogonal to an extending direction of the coupling region is smaller than a width of a region between the first and second power supply terminals.

5. The resonance device according to claim 1, wherein the insulating layer comprises a plurality of insulating films.

* * * * *